US006392951B2

(12) United States Patent
Fujima et al.

(10) Patent No.: US 6,392,951 B2
(45) Date of Patent: May 21, 2002

(54) SEMICONDUCTOR STORAGE DEVICE

(75) Inventors: Shiro Fujima; Toru Ishikawa, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/813,684

(22) Filed: Mar. 20, 2001

(30) Foreign Application Priority Data

Mar. 23, 2000 (JP) ........................................ 2000-082660

(51) Int. Cl.[7] ................................................ G11C 8/00
(52) U.S. Cl. ........................ 365/230.03; 365/230.06; 365/207
(58) Field of Search ................................ 365/205, 207, 365/208, 230.03, 226, 230.06

(56) References Cited

U.S. PATENT DOCUMENTS 6,052,323 A * 4/2000 Kawamura .................. 365/207
6,175,516 B1 * 1/2001 Kitsukawa et al. .......... 365/205
6,121,110 A1 * 4/2001 Sakamoto et al. ........... 365/207
6,236,605 B1 * 5/2001 Mori et al. .................. 365/207

FOREIGN PATENT DOCUMENTS

JP  9-219091  8/1997

* cited by examiner

Primary Examiner—Trong Phan
(74) Attorney, Agent, or Firm—Darryl G. Walker

(57) ABSTRACT

A semiconductor storage device (100) is disclosed that includes sense amplifier rows (SA0 to SA16) that receive a common sense amplifier drive voltage VINTA supplied by a internal voltage driver (5) having a high current source mode. According to one embodiment, the semiconductor storage device (100) may include banks of memory cells (B0 to B15), row decoders (DC0 to DC15), bank enable generation circuits (EC0 to EC15), sense amplifier rows (SA0 to SA16), sense amplifier drivers (DRA0 to DRA16), sense amplifier control circuits (SCA0 to SCA16), and internal voltage drivers (5 and 6). Internal voltage driver (5) can include a high current source or high voltage source mode, which can be received by a sense amplifier row (SA0 to SA16) during predetermined initial sense period. Other sense amplifier rows (SA0 to SA16) having already sensed data can be isolated from internal voltage driver (5) during the high current source or high voltage source mode.

20 Claims, 10 Drawing Sheets

SEMICONDUCTOR STORAGE DEVICE

TECHNICAL FIELD

The present invention relates generally to semiconductor storage devices, and more particularly to sensing circuitry commonly used between a plurality of banks in a semiconductor storage device.

BACKGROUND OF THE INVENTION

Semiconductor storage devices, such as a Dynamic Random Access Memory (DRAM) store data on storage capacitors in a storage cell. Data can be read from or written to a storage cell by charging or discharging a storage capacitor. Because the charge on a storage capacitor is very small, it is required to sense the charge using a sense amp when data is read from a particular storage cell. Such charging/discharging can prevent the semiconductor storage device from operating at speeds as high as the central processing unit (CPU) requesting the information from the semiconductor storage device.

In order to improve operating speeds, semiconductor storage devices have been developed that divide a memory array into a plurality of independently operated banks of memory cells. The banks are then operated simultaneously in a manner such that one bank can be transmitting or receiving data while another is being activated and having a row of data sensed in preparation for an access operation to or from the bank. Such a semiconductor storage device can be considered to be composed of separate memory chips because each of the banks can operate independently.

An example of a semiconductor storage device using a multi-bank structure is disclosed in Japanese Patent Application Laid-Open No. Hei 9-219091. The semiconductor storage device disclosed in Japanese Patent Application Laid-Open No. Hei 9-219091 is a synchronous DRAM (SDRAM) which operates in synchronization with an edge of an externally supplied clock. The SDRAM disclosed in Hei 9-219091 is composed of a small number of banks, such as four.

Because each of the banks can be independently operated, in order to simultaneously activate a plurality of banks, control circuits are provided separately for each bank. For each bank, separate signal lines for transmitting various signals from the control circuits to the banks must also be provided. Control circuits include a row decoder (X-address decoder) and a column decoder (Y-address decoder) that decode external address signals. Control circuits can also include buffers that receive external control and address signals, and a row of sense amplifiers for sensing the logic level stored in a row of memory cells. Control circuits can also include control circuits for generating timing signals that control the previously mentioned circuits under various modes of operation.

Even when control circuits and control signal lines are provided for each of the banks, significant adverse problems can be minimized as long as the number of banks remain as low as four. However, when the number of independently operating banks increases beyond four to, for example, sixteen, thirty-two, etc., an adverse problem of an increased chip size corresponding to the increased number of banks can be problematic. Particularly, the chip area occupied by timing control circuits can be significantly large as compared to the chip area occupied by other circuits. Thus, as higher speed operation is needed such that the number of independently operating banks increases, chip size can be adversely affected.

In the above example, commands are externally supplied to the semiconductor storage device. A command decoder can receive these commands. Timing control circuits can receive the decoded commands and generate respective timing control signals by appropriately delaying signals to give desired timings. The delay can be provided by a plurality of inverters connected in series. These chains of inverters can result in an increased chip area occupied by the timing control circuits. Because some of the timing control signals are to be supplied to other areas of the semiconductor storage device or to a large number of circuits within a bank, the final driver stage needs a large current driving capability. This can require the final driver stage to include large sized transistors, which can further increase chip size.

In view of the above, a portion of control circuits provided for each of the banks is often shared. One such scheme includes a semiconductor storage device in which sense amplifier circuits are shared by adjacent banks. Such a configuration will now be described with reference to a number of drawings.

Referring now to FIG. 10, a block schematic diagram of a semiconductor storage device, having sense amplifiers shared by adjacent banks, is set forth and designated by the general reference character 1000. Semiconductor storage device 1000 illustrates components associated with bank activation up to sensing data from a row of memory cells in a bank. Other components that are included in a DRAM, in general, and known to those skilled in the art, have been omitted. Such circuits include, respective memory cells, precharging circuits, column (Y-address) decoders, column selection switches, input/output (I/O) lines, read/write amplifiers, output buffers, I/O pads, etc have been omitted from the illustration for clarity.

Semiconductor storage device 1000 includes sixteen banks (B0 to B15). Each bank (B0 to B15) has an identical configuration. Each bank (B0 to B15) includes a plurality of word lines (not shown) arranged along the row direction and a plurality of bit line pairs (partially shown) arranged in a column direction. Memory cells (not shown) are provided at cross-points of the word lines and the bit lines.

When a row address activation signal RAA becomes active (high in this case), a timing control circuit 1 activates an address enable signal AE and a sense enable signal SE (both high) at predetermined timings. These timings will be explained more in detail in accordance with the description of the present invention.

Row address buffer 2 receives an external address signal ADR and generates a row address signal RA when address enable signal AE becomes active (high).

Bank decoder 3 activates one of bank selection signal (BS0 to BS15) according to the value of a bank address included in address signal ADR.

Bank enable signal generation circuits (EC0 to EC15) are provided to correspond to banks (B0 to B15) respectively. A particular bank enable signal generation circuit ECn (where n can be an integer from 1 to 14) sets a bank enable signal BEn of the corresponding bank Bn to an enable state (high in this case) only when a bank selection signal BSn of the corresponding bank Bn is enabled (high) and both of the bank selection signals (BSn−1 and BSn+1) of the adjacent banks are disabled (low). However, the end banks (B0 or B15) are set to an enbable state when a bank selection signal (BS0 or BS15) of the corresponding bank (B0 or B15) is enabled and bank selection signal (BS1 in the case of end bank B0 or BS14 in the case of end bank B15) of the adjacent bank is disabled. This prevents two adjacent banks from being active simultaneously and having a conflict at a shared sense amplifier row (SA0 to SA16).

Row decoders (DC0 to DC15) are provided to correspond to banks (B0 to B15), respectively. Each row decoder (DC0 to DC15) can decode a row address signal RA provided by row address buffer 2 when the corresponding bank enable signal (BE0 to BE15) becomes active. In this manner, a row decoder (DC0 to DC15) can activate only the word line specified by the row address signal RA among the word lines in the corresponding bank (B0 to B15).

Sense amplifier rows (SA0 to SA16) are provided at each side of banks (B0 to B15). Sense amplifier rows (SA1 to SA15) can be shared between two adjacent banks (B0 to B15). End sense amplifier rows (SA0 and SA16) can be unshared. Each sense amplifier bank (SA0 to SA16) can contain half as many sense amplifiers as there are bit line pairs in each bank (B0 to B15). Within a bank (B0 to B15) every other bit line pair can extend to be received by a sense amplifier in one of the adjacent sense amplifier rows (SA0 to SA16) while the other bit line pairs can each extend to be received by a sense amplifier in the other adjacent sense amplifier row (SA0 to SA16). Each Sense amplifier in the sense amplifier rows (SA0 to SA16) can sense small potential differences in the received bit line pair, and produces a logic level corresponding with the potential difference.

A pulse generation circuit 4 enables (high in this case) an overdrive signal VOP for a predetermined period (for example, several nanoseconds) when the sense enable signal SE is enabled.

An internal voltage driver 5 generates a sense amplifier drive voltage VINTA. Due to reduced transistor sizes and reduced power consumption desires, it is common to use a sense amplifier drive voltage VINTA that has a lower potential than an external power source voltage VCC. However, it is desired for the sense amplifier to sense data at a relatively fast speed. Thus, the current drive capabilities of internal voltage driver 5 can be increased by temporarily providing a low resistive path between external power source voltage VCC and sense amplifier drive voltage VINTA shortly before the beginning of the sensing operation. This can be thought of as an overdrive condition in which the current drive capability of the sense amplifiers can be improved. This is necessary because the bit lines can have relatively high capacitances due to a large number of memory cells being connected to each bit line. It is undesirable for the internal voltage driver 5 to continuously provide a high current source capability because this can increase power consumption. Once the sense amplifiers have achieved a high enough "split" on the bit lines, the current source capability of internal voltage driver 5 can be reduced.

Referring now to FIG. 11, a circuit schematic diagram of internal voltage driver 5 is set forth. Internal voltage driver 5 includes a drive circuit 51, a comparator 52, and a overdrive circuit 53. Comparator 52 receives a reference voltage VREF at a negative input the sense amplifier drive voltage VINTA at a positive input. Comparator 52 produces a drive control signal 54 that can be received by the drive circuit 51. Drive circuit 51 receives the drive control signal 54 and generates a regulated sense amplifier drive voltage VINTA by modulating an impedance path between external voltage source VCC and sense amplifier drive voltage VINTA based on the drive control signal 54. Drive circuit 51 can be a pc-channel insulated gate field effect transistor (IGFET). When sense amplifier drive voltage VINTA is at a lower potential than reference voltage VREF, comparator 52 produces a low output which reduces the impedance path between the external voltage source VCC and the sense amplifier drive voltage VINTA. Thus, increasing the current drive of the internal voltage driver 5. When sense amplifier drive voltage VINTA is at a higher potential than reference voltage VREF, comparator 52 produces a high output which increases the impedance path between the external voltage source VCC and the sense amplifier drive voltage VINTA.

Internal voltage driver 5 includes a overdrive circuit 53. Overdrive circuit 53 receives overdrive signal VOP and provides a low impedance path between a low voltage source VSS and drive control signal 54 when overdrive signal VOP is in an overdrive enable state (high in this case) and a high impedance path when overdrive signal VOP is in an overdrive not enabled state. Thus, drive control signal 54 can be at a logic low when overdrive signal VOP is in the overdrive enable state. The logic low at drive control signal 54 causes drive circuit 51 to provide a low impedance path between VCC and sense amplifier drive voltage VINTA. However, when overdrive signal VOP is in an overdrive not enabled state, drive circuit is controlled by the comparator 52. Overdrive circuit 53 can be an n-channel IGFET.

As mentioned above, internal voltage driver 5 overdrives the sense amplifier drive voltage VINTA towards the external power source voltage VCC during a period when overdrive signal VOP is in an overdrive enable state (high). Thus, internal voltage driver 5 can provide increased current sourcing capabilities at an initial sensing period.

Referring once again to FIG. 10, semiconductor storage device 1000 also includes sense amplifier control circuits (SCD0 to SCD16) and sense amplifier drivers (DRD0 to DRD16). Sense amplifier control circuits (SCD0 to SCD16) receive sense enable signal SE and based upon the selected bank (B0 to B15) can activate a high sense drive line control signal (SEP0 to SEP16) and a low sense drive line control signal (SEN0 to SEN16).

Referring now to FIG. 12, a portion of semiconductor storage device 1000 is set forth in a block schematic diagram. The portion of semiconductor storage device 1000 illustrates three banks (B0 to B2), four sense amplifier rows (SA0 to SA3), and four conventional sense amplifier drivers (DRD0 to DRD3).

Conventional sense amplifier drivers (DRD0 to DRD3) receive high and low sense line drive signals (SEP0 to SEP3 and SEN0 to SEN3) from sense amplifier control circuit (SCD0 to SCD3), respectively. Conventional sense amplifier drivers (DRD0 to DRD3) also receive sense amplifier drive voltage VINTA and low voltage source VSS and can provide high and low sense line potentials to high and low sense line drive signals (SEP0 to SEP3 and SEN0 to SEN3), respectively.

Each sense amplifier driver (DRD0 to DRD3) includes a high sense amplifier drive circuit (TRSEP0 to TRSEP3), respectively. High sense amplifier drive circuit (TRSEP0 to TRSEP3) each can receive a high sense drive line control signal (SEP0 to SEP3), respectively. When a respective high sense drive line control signal (SEP0 to SEP3) is in an enabled state (logic low), the corresponding high sense amplifier drive circuit (TRSEP0 to TRSEP3) provides a low impedance between sense amplifier drive voltage VINTA and the respective high sense amplifier drive line (SAP0 to SAP3). When a respective high sense drive line control signal (SEP0 to SEP3) is in a not enabled state (logic high), the corresponding high sense amplifier drive circuit (TRSEP0 to TRSEP3) provides a high impedance between sense amplifier drive voltage VINTA and the respective high sense amplifier drive line (SAP0 to SAP3). Each high sense amplifier drive circuit (TRSEP0 to TRSEP3) can be a p-channel IGFET.

Each sense amplifier driver (DRD0 to DRD3) also includes a low sense amplifier drive circuit (TRSEN0 to TRSEN3), respectively. Low sense amplifier drive circuit (TRSEN0 to TRSEN3) each can receive a low sense drive line control signal (SEN0 to SEN3), respectively. When a respective low sense drive line control signal (SEN0 to SEN3) is in an enabled state (logic high), the corresponding low sense amplifier drive circuit (TRSEN0 to TRSEN3) provides a low impedance between low voltage source VSS and the respective low sense amplifier drive line (SAN0 to SAN3). When a respective low sense line drive signal (SEN0 to SEN3) is in a not enabled state (logic low), the corresponding low sense amplifier drive circuit (TRSEN0 to TRSEN3) provides a high impedance between low voltage source VSS and the respective low sense amplifier drive line (SAN0 to SAN3). Each low sense amplifier drive circuit (TRSEN0 to TRSEN3) can be a n-channel IGFET.

The operation of the semiconductor storage device 1000 having conventional sense amplifier drivers (DRD0 to DRD16) will now be described.

The following is an example for a case in which bank B0 becomes active and while data is being read out of bank B0, bank B2 becomes activated in preparation for data being read out after the read operation from bank B0 is completed. Initially no banks are activated. Initial conditions of address enable signal AE, sense enable signal SE, bank selection signals (BS0 to BS15), bank enable signals (BE0 to BE15), overdrive signal VOP and low sense drive line control signals (SEN0 to SEN16) are all in their not enabled condition and are thus at a logic low. Initial conditions of the high sense drive line control signals (SEP0 to SEP16) are all in their not enabled condition and are thus at a logic high.

First, the semiconductor storage device 1000 can receive a bank activate command to activate bank B0. In the bank activate command an address signal ADR is received which includes a bank address for bank B0, as well as a row address RA. The bank activate command can be received by a command decoder (not shown). The row address activation signal RAA can then be enabled for a predetermined period (a few nanoseconds, as just an example) and timing control circuit 1 can then activate address enable signal AE for a predetermined period (a few nanoseconds, as just an example), thus allowing the row and bank addresses to be latched in row address buffer 2 and bank decoder 3, respectively.

Bank decoder 3 can then activate bank selection signal BS0. With the bank selection signal BS0 activated (logic high in this case), bank enable signal generation circuit EC0 can activate the bank enable signal BE0.

When bank enable signal BE0 activated (logic high in this case), row decoder DC0 can decode the row address signal RA and activate the word line specified by the row address signal RA.

When bit lines pairs have achieved a sufficient voltage differential, timing control circuit 1 can place the sense enable signal SE in the enable state (logic high in this case) for a predetermined period (a few nanoseconds, as just an example).

When the sense enable signal SE becomes enabled, sense amplifier rows (SA0 and SA1) provided at opposite sides of the selected bank B0 amplify the potential differences on the bit line pairs and provide a row of data which can be selected by column addresses.

Referring now to FIG. 13, a timing diagram is set forth illustrating the conventional sensing operation. The timing diagram of FIG. 13 includes waveforms for overdrive signal VOP and sense amplifier drive voltage VINTA. The timing diagram of FIG. 13 also includes bank B0 sense signals, such as high sense drive line control signals SEP0/1 (indicating SEP0 and SEP1), low sense drive line control signals SEN0/1 (indicating SEN0 and SEN1), and sense drive lines SAP/N 0/1 (indicating SAP0, SAP1, SAN0, and SAN1). Also included is a bit line pair D/DB 0/1 indicating a complementary bit line pair (D and DB) connected to sense amplifier rows SA0 and SA1, respectively. The timing diagram of FIG. 13 further includes bank B2 sense signals, such as high sense drive line control signals SEP2/3 (indicating SEP2 and SEP3), low sense drive line control signals SEN2/3 (indicating SEN2 and SEN3), and sense drive lines SAP/N 2/3 (indicating SAP2, SAP3, SAN2, and SAN3). Also included is a bit line pair D/DB 2/3 indicating a complementary bit line pair (D and DB) connected to sense amplifier rows SA2 and SA3, respectively.

When sense enable signal SE becomes activated (logic high in this case), pulse generation circuit 4 can set overdrive signal VOP to the overdrive state (logic high) for a predetermined period (for as long as several nanoseconds, for example). During the period in which overdrive signal VOP is in the overdrive state, internal voltage driver 5 overdrives the sense amplifier drive voltage VINTA towards the external power source voltage VCC by providing a low impedance path from sense amplifier drive voltage VINTA to the external power source voltage VCC.

When overdrive signal VOP returns low, the overdrive condition of sense amplifier drive voltage VINTA is terminated. At this time, sense amplifier control circuit SCD0 sets the high sense drive line control signal SEP0 to a low logic level and the low sense drive line control signal SEN0 to a high logic level. At the same time, sense amplifier control circuit SCD1 sets the high sense drive line control signal SEP1 to a low logic level and the low sense drive line control signal SEN1 to a high logic level.

With high sense drive line control signal SEP0 at a logic low level, high sense amplifier drive circuit TRSEP0, shown in FIG. 12, provides a low impedance path between high sense drive line SAP0 and sense amplifier drive voltage VINTA. With high sense drive line control signal SEP1 at a logic low level, high sense amplifier drive circuit TRSEP1, shown in FIG. 12, provides a low impedance path between high sense drive line SAP1 and sense amplifier drive voltage VINTA. With low sense drive line control signal SEN0 at a logic high level, low sense amplifier drive circuit TRSEN0, shown in FIG. 12, provides a low impedance path between low sense drive line SAN0 and low voltage source VSS. With low sense drive line control signal SEN1 at a logic high level, low sense amplifier drive circuit TRSEN1, shown in FIG. 12, provides a low impedance path between low sense drive line SAN1 and low voltage source VSS.

With high and low sense amplifier drive circuits (TRSEP0/1 and TRSEN0/1) activated, high and low sense drive lines (SAP0/1 and SAN0/1) are driven to the sense amplifier drive voltage VINTA and low voltage source VSS, respectively. In this manner sense amplifier rows (SA0 and SA1) become activated and amplify potential differences in each bit line pair of bank B0.

After the sense amplifier rows (SA0 and SA1) have properly sensed data from the selected row of memory cells in bank B0, a column decoder (not illustrated) can decode a received column address. Based on the column address, the column decoder can turn on a column selection switch, which can allow a selected sense amplifier to drive sensed data to an I/O. The data can then propagate through a data amplifier, output buffer and onto an I/O pad to be provided onto a bus external to the bus (none of which is illustrated). Through this process, data is read out from bank B0.

During the time in which bank B0 remains activated, a bank activation command for bank B2 can be received by the semiconductor storage device 1000. Similarly to the bank activation command for bank B0, an address signal ADR specifying the bank (B2) and a row address signal RA is supplied to the semiconductor storage device 1000. Bank B2 can then be activated and data read out in a manner similar to the description above.

Internal voltage driver 5 overdrives the sense amplifier drive voltage VINTA at the beginning of every sensing operation. As show in in FIG. 12, the sense amplifier drive voltage VINTA is shared among the sense amplifier rows (SA0 to SA16). Accordingly, in the semiconductor storage device 1000, using the conventional sensing scheme as shown, the overdriven sense amplifier driving voltage VINTA is supplied to sense amplifier rows (for example SA0 and SA1 as illustrated in FIG. 13) which have already finished their sensing every time another bank (for example B2 as illustrated in FIG. 13) is activated. As a result, voltages levels of the high sense drive lines (SAP0 and SAP1 as illustrated during bank B2 sensing in FIG. 13) are raised to a higher level. This can also cause voltages of bit lines (D/DB 0/1 in FIG. 13) to be raised to a higher level. An increased voltage level on bit lines can lead to reliability problems due to excessive electric fields inducing early breakdown conditions. This can also affect sense margins.

In view of the above discussion, it would be desirable to provide a semiconductor storage device that can have a sense amplifier driving voltage that can have increased current sourcing capabilities at critical sense activation timings. It is desirable to provide the increased current sourcing capabilities without increasing the sense amplifier driving voltage on sense amplifier rows that are already activated even when a plurality of sense amplifier rows share the same sense amplifier driving voltage.

SUMMARY OF THE INVENTION

According to the present embodiments, semiconductor storage device includes semse amplifier rows that can receive a common sense amplifier drive voltage applied by an internal voltage driver having a overdrive mode. Semiconductor storage device can include banks of memory cells, row decoders, sense amplifier rows, and sense amplifier drivers. An internal voltage driver can include an overdrive mode, which can be received by a sense amplifier row during an initial portion of a sense operation.

According to one aspect of the embodiments, sense amplifier drivers can include a high sense amplifier drive circuit and a high sense amplifier boost drive circuit. High sense amplifier boost drive circuit can be enabled for a predetermined period during an initial portion of a sense operation and can otherwise be disabled.

According to another aspect of the embodiments, high sense amplifier boost drive circuit can receive a high sense amplifier drive boost control signal. When in a boost enabled state, the high sense amplifier boost control signal can cause a high sense amplifier boost drive voltage to be coupled to a high sense drive line.

According to another aspect of the embodiments, high sense amplifier boost drive voltage can be provided by an internal voltage driver having an overdrive mode in which high sense amplifier boost drive voltage can provide higher current source capabilities and/or a higher voltage potential.

According to another aspect of the embodiments, a pulse generator can generate a boost control signal that places an internal voltage driver in an overdrive mode for a predetermined period at an initial portion of a sense operation.

According to another aspect of the embodiments, high sense amplifier boost drive voltage can be an externally supplied voltage source.

According to another aspect of the embodiments, semiconductor storage device can include a plurality of banks having a predetermined bank address, adjacent banks can share a sense amplifier row.

According to another aspect of the embodiments, semiconductor storage device and have a bank activation mode in which a bank address can be received.

According to another aspect of the embodiments, when a first sense amplifier row is operating in a sense operation timing that is not the initial portion of a sense operation of the first sense amplifier row and a second sense amplifier row is operating in a sense operation timing that is the initial portion of a sense operation for the second sense amplifier row, a first high sense amplifier boost control signal is in the disabled state, a second high sense amplifier boost control signal is in the enabled state, a first high sense amplifier drive control signal is in the enabled state and a second high sense amplifier drive control signal is in the disabled state.

According to another aspect of the embodiments, the high sense amplifier drive circuit and the high sense amplifier boost drive circuit can be a p-channel IGFET.

According to another aspect of the embodiments, a pulse generation circuit generates an overdrive signal and the internal voltage driver is in the overdrive mode when the overdrive signal is in a first logic level and provides a regulated voltage level when the overdrive signal is in a second logic level.

DETAILED DESCRIPTION OF THE EMBODIMENTS

Various embodiments of the present invention will now be described in detail with reference to a number of drawings.

Figure 1:
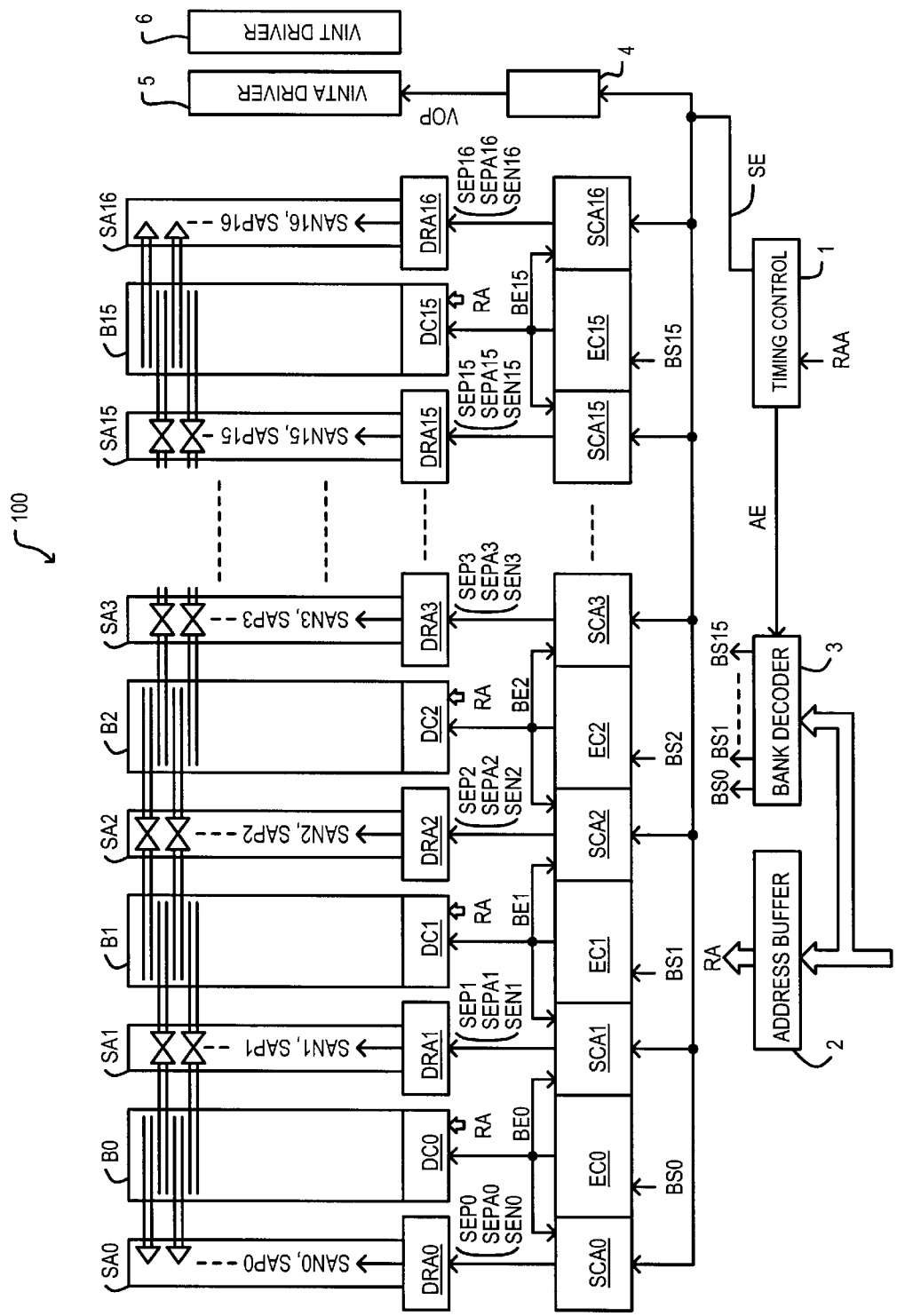
FIG. 1 is a block schematic diagram of a semiconductor storage device according to an embodiment.
Figure 10:
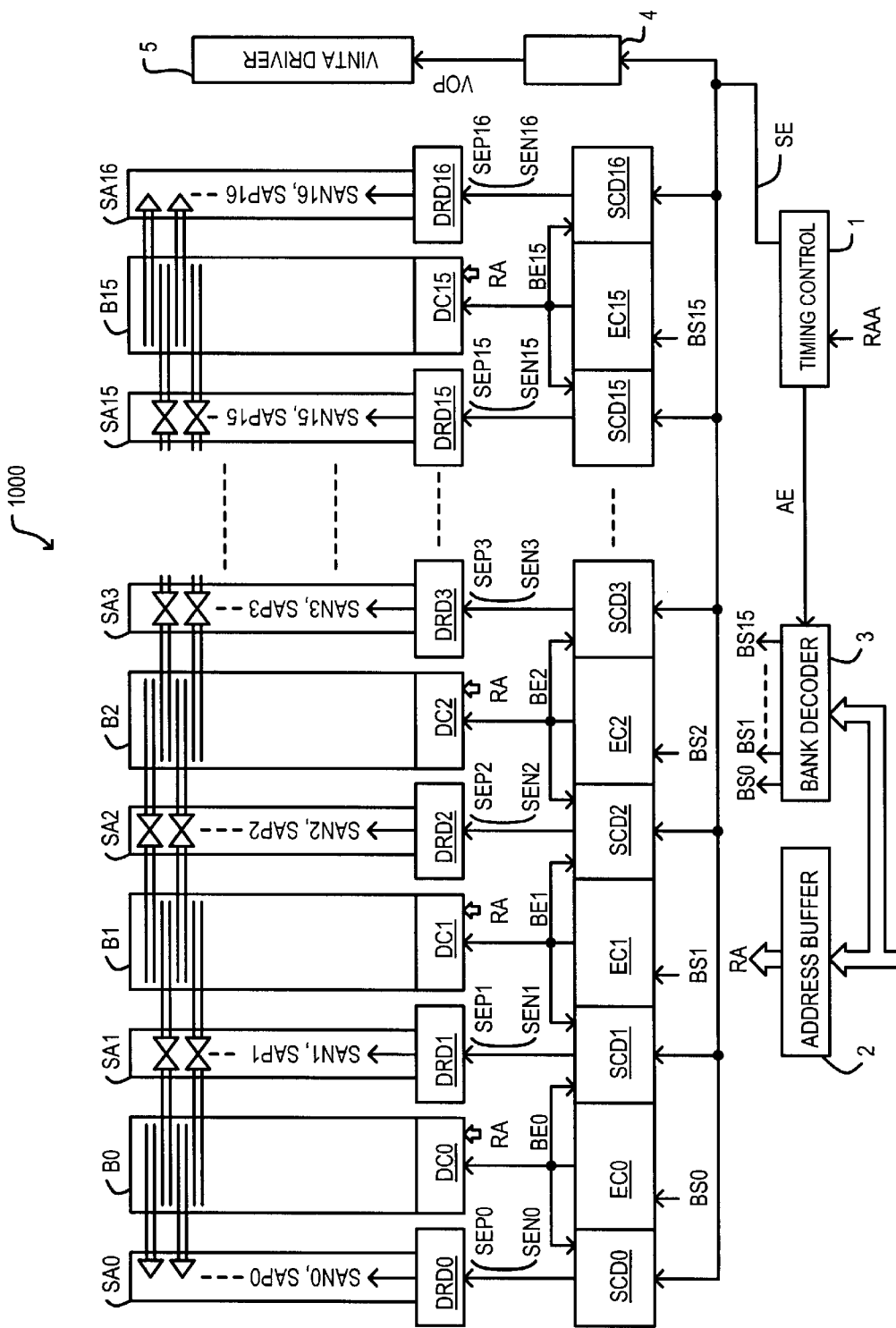
FIG. 10 is a block schematic diagram of a conventional semiconductor storage device.

Referring now to FIG. 1, a semiconductor storage device according to an embodiment is set forth in a block schematic diagram and given the general reference character 100. Semiconductor storage device 100 can include constituents that are similar to constituents of semiconductor storage device 1000 of FIG. 10. Thus, such constituents will be given the same reference character. Descriptions of such constituents may be omitted.

In addition to internal voltage driver 5 which can provide a sense amplifier drive voltage VINTA, semiconductor storage device 100 can include an internal voltage driver 6 which can provide a sense amplifier drive voltage VINT. Semiconductor storage device 100 can further include sense amplifier control circuits (SCA0 to SCA16) and sense amplifier drivers (DRA0 to DRA16). Otherwise, semiconductor storage device 100 of FIG. 1 can have similar constituents to the conventional semiconductor storage device 1000 of FIG. 10.

In the embodiment of FIG. 1, internal voltage driver 6 can generate a sense amplifier drive voltage VINT. Internal voltage driver 6 can differ from internal voltage driver 5 in that no overdrive may be provided for internal voltage driver 6.

Figure 2:
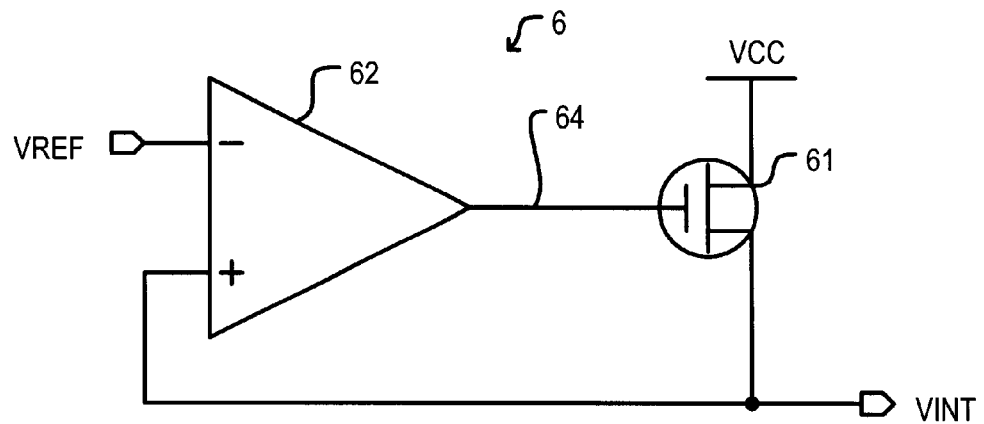
FIG. 2 is a circuit diagram of an internal voltage driver.
Figure 11:
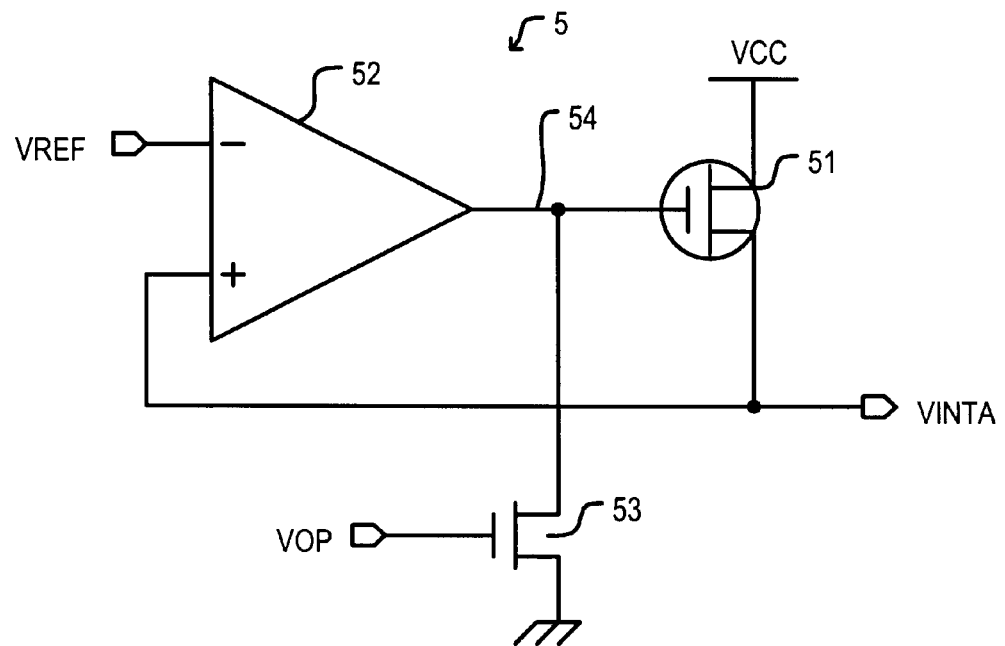
FIG. 11 is circuit diagram of an internal voltage driver.

Referring now to FIG. 2, a circuit schematic diagram of internal voltage driver 6 is set forth. Internal voltage driver 6 includes a drive circuit 61 and a comparator 62. Comparator 62 can receive a reference voltage VREF at a negative input, and the sense amplifier drive voltage VINT at a positive input. Comparator 62 produces a drive control signal 64 that can be received by the drive circuit 61. Drive circuit 61 receives the drive control signal 64 and generates a regulated sense amplifier drive voltage VINT by modulating an impedance path between external voltage source VCC and sense amplifier drive voltage VINT based on the drive control signal 64. Drive circuit 61 can be a p-channel insulated gate field effect transistor (IGFET). When sense amplifier drive voltage VINT is at a lower potential than reference voltage VREF, comparator 62 can produce a low output which reduces the impedance path between the external voltage source VCC and the sense amplifier drive voltage VINT. This can increase the current drive of the internal voltage driver 6. When sense amplifier drive voltage VINT is at a higher potential than reference voltage VREF, comparator 62 can produce a high output which increases the impedance path between the external voltage source VCC and the sense amplifier drive voltage VINT.

With the above configuration and operation, internal voltage driver 6 can maintain sense amplifier drive voltage VINT at a relatively constant potential.

Figure 3:
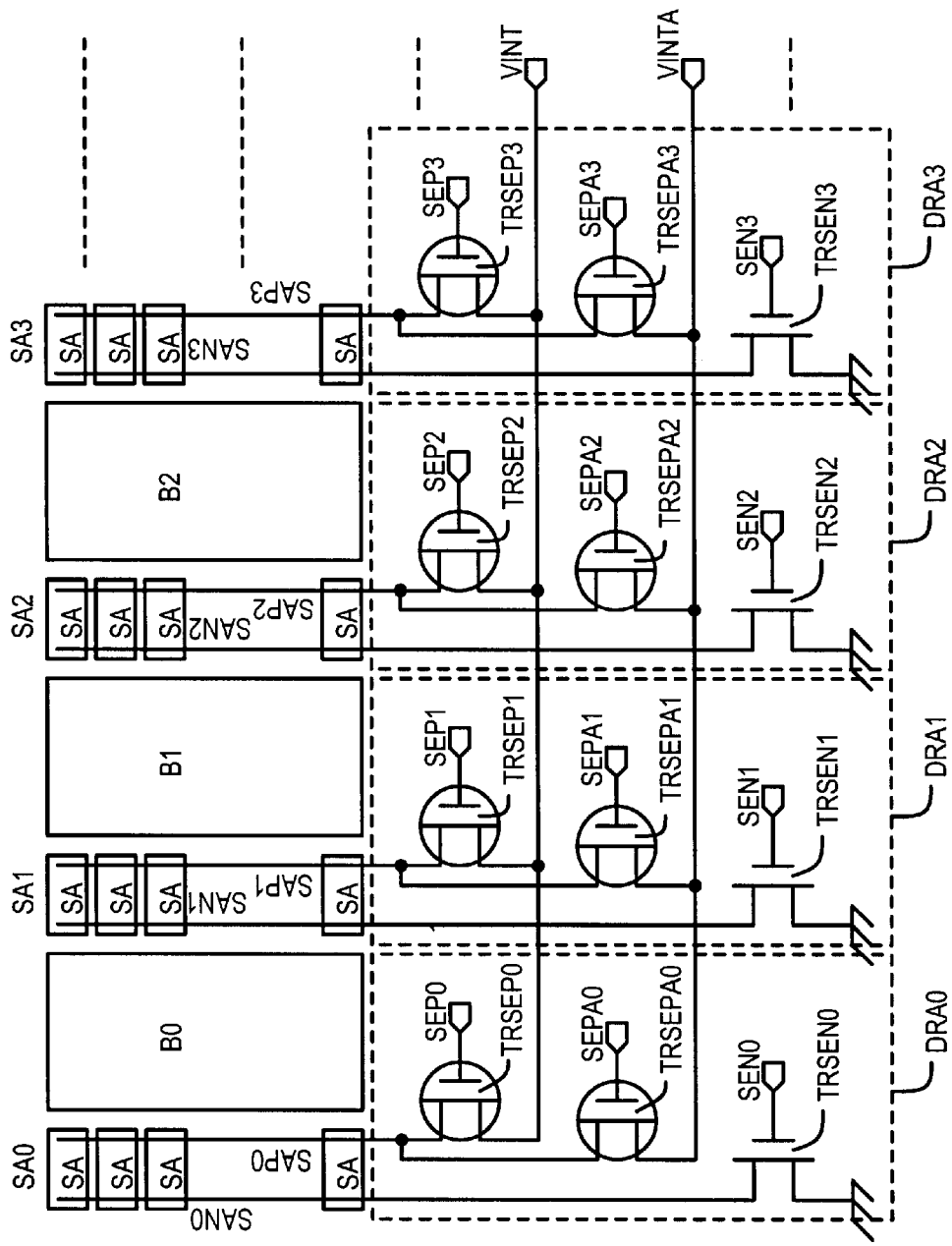
FIG. 3 is a block schematic diagram of a portion of the semiconductor storage device of FIG. 1.

Referring now to FIG. 3, a portion of semiconductor storage device 100 is set forth in a block schematic diagram. The portion of semiconductor storage device 100 illustrates three banks (B0 to B2), four sense amplifier rows (SA0 to SA3), and four sense amplifier drivers (DRA0 to DRA3).

Sense amplifier drivers (DRA0 to DRA3) can receive high and low sense line drive control signals (SEP0 to SEP3, SEPA0 to SEPA3, and SEN0 to SEN3) from sense amplifier control circuit (SCA0 to SCA3), respectively. Sense amplifier drivers (DRA0 to DRA3) can also receive sense amplifier drive voltage VINT, sense amplifier drive voltage VINTA, and low voltage source VSS. Sense amplifier drivers (DRA0 to DRA3) can provide high and low sense line potentials to high and low sense line drive signals (SEP0 to SEP3 and SEN0 to SEN3), respectively.

Each sense amplifier driver (DRA0 to DRA3) can include a high sense amplifier drive circuit (TRSEP0 to TRSEP3), respectively. High sense amplifier drive circuit (TRSEP0 to TRSEP3) each can receive a high sense drive line control signal (SEP0 to SEP3), respectively. When a respective high sense drive line control signal (SEP0 to SEP3) is in an enabled state (logic low), the corresponding high sense amplifier drive circuit (TRSEP0 to TRSEP3) can provide a low impedance between sense amplifier drive voltage VINT and the respective high sense amplifier drive line (SAP0 to SAP3). When a respective high sense drive line control signal (SEP0 to SEP3) is in a not enabled state (logic high), the corresponding high sense amplifier drive circuit (TRSEP0 to TRSEP3) can provide a high impedance between sense amplifier drive voltage VINT and the respective high sense amplifier drive line (SAP0 to SAP3). Each high sense amplifier drive circuit (TRSEP0 to TRSEP3) can be a p-channel IGFET.

Each sense amplifier driver (DRA0 to DRA3) also can include a high sense amplifier boost drive circuit (TRSEPA0 to TRSEPA3), respectively. High sense amplifier boost drive circuits (TRSEPA0 to TRSEPA3) each can receive a high sense drive line boost control signal (SEPA0 to SEPA3), respectively. When a respective high sense drive line boost control signal (SEPA0 to SEPA3) is in an enabled state (logic low), the corresponding high sense amplifier boost drive circuit (TRSEPA0 to TRSEPA3) can provide a low impedance between sense amplifier drive voltage VINTA and the respective high sense amplifier drive line (SAP0 to SAP3). When a respective high sense drive line boost control signal (SEPA0 to SEPA3) is in a not enabled state (logic high), the corresponding high sense amplifier boost drive circuit (TRSEPA0 to TRSEPA3) can provide a high impedance between sense amplifier drive voltage VINTA and the respective high sense amplifier drive line (SAP0 to SAP3). Each high sense amplifier boost drive circuit (TRSEPA0 to TRSEPA3) can be a p-channel IGFET.

Each sense amplifier driver (DRA0 to DRA3) can also include a low sense amplifier drive circuit (TRSEN0 to TRSEN3), respectively. Low sense amplifier drive circuit (TRSEN0 to TRSEN3) each can receive a low sense drive line control signal (SEN0 to SEN3), respectively. When a respective low sense drive line control signal (SEN0 to SEN3) is in an enabled state (logic high), the corresponding low sense amplifier drive circuit (TRSEN0 to TRSEN3) can provide a low impedance between low voltage source VSS and the respective low sense amplifier drive line (SAN0 to SAN3). When a respective low sense line drive signal (SEN0 to SEN3) is in an not enabled state (logic low), the corresponding low sense amplifier drive circuit (TRSEN0 to TRSEN3) can provide a high impedance between low voltage source VSS and the respective low sense amplifier drive line (SAN0 to SAN3). Each low sense amplifier drive circuit (TRSEN0 to TRSEN3) can be an n-channel IGFET.

Referring once again to FIG. 1, sense amplifier control circuits (SCA0 to SCA16) can be provided to correspond to sense amplifier drivers (DRA0 to DRA16), respectively. When sense enable signal SE becomes active (high, in this case), selected sense amplifier control circuits (SCA0 to SCA16) can place their corresponding low and high sense drive line control signals (SEP0 to SEP16 and SEN0 to SEN16) into an active state according to predetermined timings. In addition, the selected sense amplifier control circuits (SCA0 to SCA16) may place their corresponding high sense drive line boost control signal (SEPA0 to SEPA16) in an active state according to a predetermined boost timing. In the case in which a certain bank (B0 to B15) is activated, the activated bank's adjacent sense amp rows (SA0 to SA16) can be activated along with their corresponding sense amplifier drivers (DRA0 to DRA16) and sense amplifier control circuits (SCA0 to SCA16).

The operation of the semiconductor storage device 100 will now be described.

The following is an example for a case in which bank B0 can become active and while data is being read out of bank B0, bank B2 can become activated in preparation for data being read out after the read operation from bank B0 is completed. Initially no banks are activated. Initial conditions of address enable signal AE, sense enable signal SE, bank selection signals (BS0 to BS15), bank enable signals (BE0 to BE15), overdrive signal VOP and low sense drive line control signals (SEN0 to SEN16) may all be in their not enabled condition and are thus at a logic low. Initial conditions of the high sense drive line control signals (SEP0 to SEP16) and high sense drive line boost control signals (SEPA0 to SEPA16) may all be in their not enabled condition and are thus at a logic high.

First, the semiconductor storage device 100 can receive a bank activate command to activate bank B0. In the bank activate command an address signal ADR can be received which includes a bank address for bank B0, as well as a row address RA. The bank activate command can be received by a command decoder (not shown). The row address activation signal RAA can then be enabled for a predetermined period (a few nanoseconds, as just an example) and timing control circuit 1 can then activate address enable signal AE for a predetermined period (a few nanoseconds, as just an example), thus allowing the row and bank addresses to be latched in row address buffer 2 and bank decoder 3, respectively.

Bank decoder 3 can then activate bank selection signal BS0. With the bank selection signal B0 activated (logic high in this case), bank enable signal generation circuit EC0 can activate the bank enable signal BE0.

When bank enable signal BE0 activated (logic high in this case), row decoder DC0 can decode the row address signal RA and activate the word line specified by the row address signal RA.

When bit lines pairs have achieved a sufficient voltage differential, timing control circuit 1 can place the sense enable signal SE in the enable state (logic high in this case) for a predetermined period (a few nanoseconds, as just an example).

Figure 4:
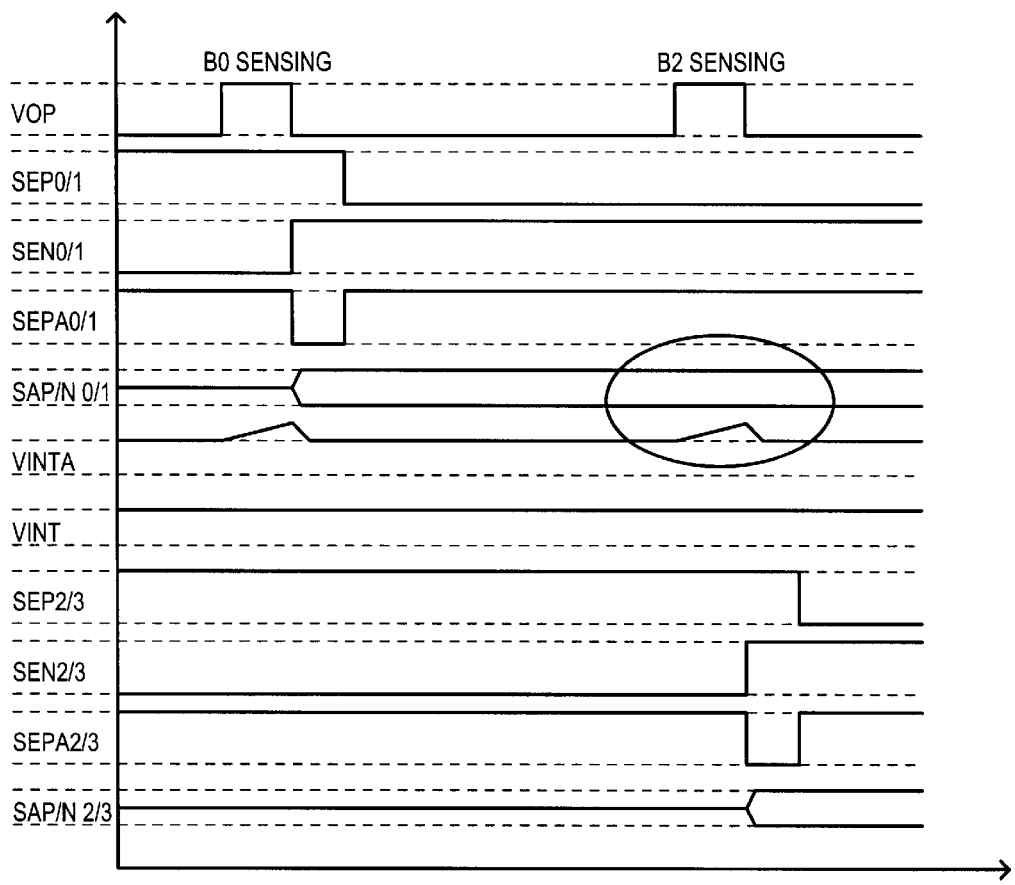
FIG. 4 is a timing diagram illustrating sensing operations of the semiconductor storage device of FIG. 1.

Referring now to FIG. 4, a timing diagram is set forth illustrating the sensing operation of the semiconductor storage device 100. The timing diagram of FIG. 4 includes waveforms for overdrive signal VOP, sense amplifier drive voltage VINTA and sense amplifier drive voltage VINT. The timing diagram of FIG. 4 also includes bank B0 sense signals, such as high sense drive line control signals SEP0/1 (indicating SEP0 and SEP1), high sense drive line boost control signals SEPA0/1 (indicating SEPA0 and SEPA1), low sense drive line control signals SEN0/1 (indicating SEN0 and SEN1), and sense drive lines SAP/N 0/1 (indicating SAP0, SAP1, SAN0, and SAN1). The timing diagram of FIG. 4 further includes bank B2 sense signals, such as high sense drive line control signals SEP2/3 (indicating SEP2 and SEP3), high sense drive line boost control signals SEPA2/3 (indicating SEPA2 and SEPA3), low sense drive line control signals SEN2/3 (indicating SEN2 and SEN3), and sense drive lines SAP/N 2/3 (indicating SAP2, SAP3, SAN2, and SAN3).

When sense enable signal SE becomes activated (logic high in this case), pulse generation circuit 4 can set overdrive signal VOP to the overdrive state (logic high) for a predetermined period (for as long as several nanoseconds, for example). During the period in which overdrive signal VOP is in the overdrive state, internal voltage driver 5 can overdrive the sense amplifier drive voltage VINTA towards the external power source voltage VCC by providing a low impedance path from sense amplifier drive voltage VINTA to the external power source voltage VCC.

When overdrive signal VOP returns low, the overdrive condition of sense amplifier drive voltage VINTA can be terminated. At this time, sense amplifier control circuit SCA0 can set the high sense drive line boost control signal SEPA0 to a low logic level and the low sense drive line control signal SEN0 to a high logic level. At the same time, sense amplifier control circuit SCA1 can set the high sense drive line boost control signal SEPA1 to a low logic level and the low sense drive line control signal SEN1 to a high logic level.

With high sense drive line boost control signal SEPA0 at a logic low level, high sense amplifier boost drive circuit TRSEPA0, shown in FIG. 3, can provide a low impedance path between high sense drive line SAP0 and sense amplifier drive voltage VINTA. With high sense drive line boost control signal SEPA1 at a logic low level, high sense amplifier boost drive circuit TRSEPA1, shown in FIG. 3, can provide a low impedance path between high sense drive line SAP1 and sense amplifier drive voltage VINTA. With low sense drive line control signal SEN0 at a logic high level, low sense amplifier drive circuit TRSEN0, shown in FIG. 3, can provide a low impedance path between low sense drive line SAN0 and low voltage source VSS. With low sense drive line control signal SEN1 at a logic high level, low sense amplifier drive circuit TRSEN1, shown in FIG. 3, can provide a low impedance path between low sense drive line SAN1 and low voltage source VSS.

With high and low sense amplifier drive circuits (TRSEP0/1 and TRSEN0/1) activated, high and low sense drive lines (SAP0/1 and SAN0/1) can be driven to the sense amplifier drive voltage VINTA and low voltage source VSS, respectively. In this manner sense amplifier rows (SA0 and SA1) can become activated and amplify potential differences in each bit line pair of bank B0.

After a predetermined time period (for example, several nanoseconds), sense amplifier control circuits SCA0 and SCA1 can return high drive line boost control signals SEPA0 and SEPA1 to a disabled state (logic high in this case). At this time, sense amplifier control circuit SCA0 can place high drive line control signal SEP0 and SEP1 in an enable state (logic low in this case).

With high sense drive line boost control signal SEPA0 at a logic high level, high sense amplifier boost drive circuit TRSEPA0, shown in FIG. 3, can provide a high impedance path between high sense drive line SAP0 and sense amplifier drive voltage VINTA. With high sense drive line boost control signal SEPA1 at a logic high level, high sense amplifier boost drive circuit TRSEPA1, shown in FIG. 3, can provide a high impedance path between high sense drive line SAP1 and sense amplifier drive voltage VINTA. With high sense drive line control signal SEP0 at a logic low level, high sense amplifier drive circuit TRSEP0, shown in FIG. 3, can provide a low impedance path between high sense drive line SAP0 and sense amplifier drive voltage VINT. With high sense drive line control signal SEP1 at a logic low level, high sense amplifier drive circuit TRSEP1, shown in FIG. 3, can provide a low impedance path between high sense drive line SAP1 and sense amplifier drive voltage VINT.

In this manner, the voltage of the selected high sense drive lines (SAP0 and SAP1) can be maintained at a potential level sense amplifier drive voltage VINT.

After the sense amplifier rows (SA0 and SA1) have properly sensed data from the selected row of memory cells in bank B0, a column decoder (not illustrated) can decode a received column address. Based on the column address, the column decoder can turn on a column selection switch, which can allow a selected sense amplifier to drive sensed data to an I/O. The data can then propagate through a data amplifier, output buffer and onto an I/O pad to be provided onto a bus external to the bus (none of which is illustrated). Through this process, data can be read out from bank B0.

During the time in which bank B0 remains activated, a bank activation command for bank B2 can be received by the semiconductor storage device 100. Similarly to the bank activation command for bank B0, an address signal ADR specifying the bank (B2) and a row address signal RA is supplied to the semiconductor storage device 100. Bank enable signal BE2 corresponding to bank B2 can then be activated.

When bank enable signal BE2 is activated (logic high in this case), row decoder DC2 can decode the row address signal RA and activate the word line specified by the row address signal RA.

When bit lines pairs have achieved a sufficient voltage differential, timing control circuit 1 can place the sense enable signal SE in the enable state (logic high in this case) for a predetermined period (a few nanoseconds, as just an example).

When sense enable signal SE has been placed in the enable state, sense amplifier rows (SA2 and SA3) located at opposite sides of the selected bank B2 can amplify the potential differences in on the bit line pairs and can provide a row of data which can be selected by column addresses.

When sense enable signal SE becomes activated (logic high in this case), pulse generation circuit 4 can set overdrive signal VOP to the overdrive state (logic high) for a predetermined period (for as long as several nanoseconds, for example). During the period in which overdrive signal VOP is in the overdrive state, internal voltage driver 5 can overdrive the sense amplifier drive voltage VINTA towards the external power source voltage VCC by providing a low impedance path from sense amplifier drive voltage VINTA to the external power source voltage VCC.

When overdrive signal VOP returns low, the overdrive condition of sense amplifier drive voltage VINTA can be terminated. At this time, sense amplifier control circuit SCA2 can set the high sense drive line boost control signal SEPA2 to a low logic level and the low sense drive line control signal SEN2 to a high logic level. At the same time, sense amplifier control circuit SCA3 can set the high sense drive line boost control signal SEPA3 to a low logic level and the low sense drive line control signal SEN3 to a high logic level.

With high sense drive line boost control signal SEPA2 at a logic low level, high sense amplifier boost drive circuit TRSEPA2, shown in FIG. 3, can provide a low impedance path between high sense drive line SAP2 and sense amplifier drive voltage VINTA. With high sense drive line boost control signal SEPA3 at a logic low level, high sense amplifier boost drive circuit TRSEPA3, shown in FIG. 3, can provide a low impedance path between high sense drive line SAP3 and sense amplifier drive voltage VINTA. With low sense drive line control signal SEN2 at a logic high level, low sense amplifier drive circuit TRSEN2, shown in FIG. 3, can provide a low impedance path between low sense drive line SAN2 and low voltage source VSS. With low sense drive line control signal SEN3 at a logic high level, low sense amplifier drive circuit TRSEN3, shown in FIG. 3, can provide a low impedance path between low sense drive line SAN3 and low voltage source VSS.

With high and low sense amplifier drive circuits (TRSEP2/3 and TRSEN2/3) activated, high and low sense drive lines (SAP2/3 and SAN2/3) can be driven to the sense amplifier drive voltage VINTA and low voltage source VSS, respectively. In this manner sense amplifier rows (SA2 and SA3) can become activated and amplify potential differences in each bit line pair of bank B2.

After a predetermined time period (for example, several nanoseconds), sense amplifier control circuits SCA2 and SCA3 can return high drive line boost control signals SEPA2 and SEPA3 to a disabled state (logic high in this case). At this time, sense amplifier control circuit SCA3 can place high drive line control signals SEP2 and SEP3 in an enable state (logic low in this case).

With high sense drive line boost control signal SEPA2 at a logic high level, high sense amplifier boost drive circuit TRSEPA2, shown in FIG. 3, can provide a high impedance path between high sense drive line SAP2 and sense amplifier drive voltage VINTA. With high sense drive line boost control signal SEPA3 at a logic high level, high sense amplifier boost drive circuit TRSEPA3, shown in FIG. 3, can provide a high impedance path between high sense drive line SAP3 and sense amplifier drive voltage VINTA. With high sense drive line control signal SEP2 at a logic low level, high sense amplifier drive circuit TRSEP2, shown in FIG. 3, can provide a low impedance path between high sense drive line SAP2 and sense amplifier drive voltage VINT. With high sense drive line control signal SEP3 at a logic low level, high sense amplifier drive circuit TRSEP3, shown in FIG. 3, can provide a low impedance path between high sense drive line SAP3 and sense amplifier drive voltage VINT.

In this manner, the voltage of the selected high sense drive lines (SAP2 and SAP3) can be maintained at a potential level sense amplifier drive voltage VINT.

After the sense amplifier rows (SA2 and SA3) have properly sensed data from the selected row of memory cells in bank B2, a column decoder (not illustrated) can decode a received column address. Based on the column address, the column decoder can turn on a column selection switch, which can allow a selected sense amplifier to drive sensed data to an I/O. The data can then propagate through a data amplifier, output buffer and onto an I/O pad to be provided onto a bus external to the bus (none of which is illustrated). Through this process, data can be read out from bank B2.

In the present embodiment of FIGS. 1 through 3, only selected ones of high sense amplifier drive lines (SAP0 to SAP16) corresponding to sense amplifier rows (SA0 to SA16) can receive sense amplifier drive voltage VINTA during an initial sense operation. Referring to FIG. 4, it can be seen that high sense amplifier drive line boost control signals (SEPA0/1 and SEPA2/3) can be enabled for only a predetermined period (for example, several nanoseconds) after the start of a sensing operation by sense amplifier rows (SA0–SA1 and SA2–SA3), respectively. After the predetermined period, high sense amplifier drive line boost control signals (SEPA0/1 and SEPA2/3) can be disabled (logic high, in this case). In this manner, only the sense amp rows (SA0–SA1 and SA2–SA3) that are in a high current sink mode of operation can receive the sense amplifier drive voltage VINTA which has a overdriven mode which can allow a boosted current sourcing capability.

Thus, even when the sense amplifier driving voltage VINTA is overdriven, the overdriven sense amplifier drive voltage VINTA can be supplied only to sense amplifier rows (SA0 to SA16) sensing a row of data in a selected bank (B0 to B15) at the start of the sensing operation. Thereafter, overdriven sense amplifier drive voltage VINTA may not be supplied to those sense amplifier rows (SA0 to SA16) that have completed the sensing operation and may simply be holding data in sense amplifier latches.

As a result, the potential of the high sense amplifier drive line of sense amplifier rows (SA0 to SA16) that have completed the sensing operation and may simply be holding data in sense amplifier latches may not be raised above the potential of sense amplifier drive voltage VINT, which may not be boosted.

Figure 5:
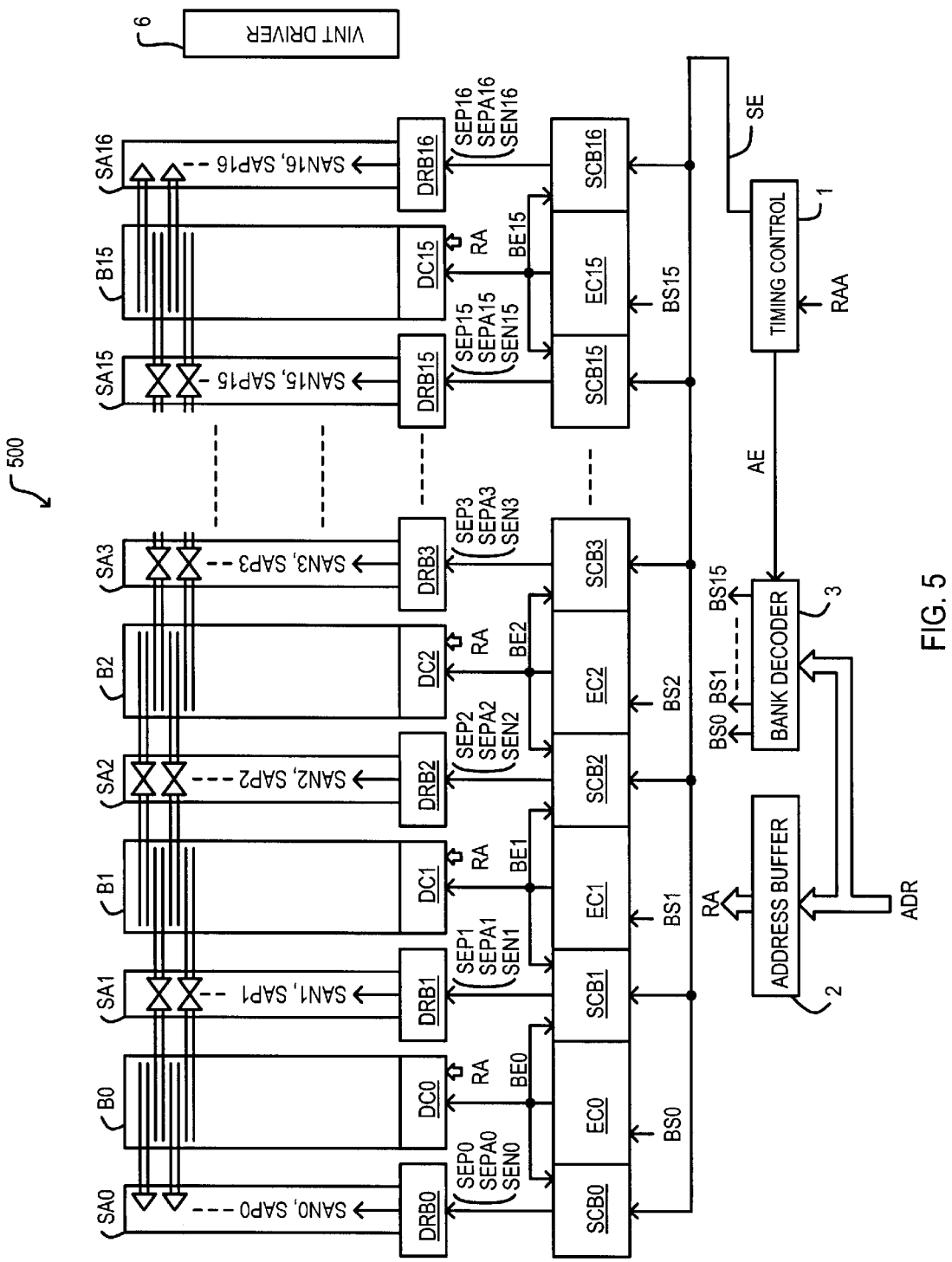
FIG. 5 is a block schematic diagram of a semiconductor storage device according to an embodiment.

Referring now to FIG. 5, a semiconductor storage device according to an embodiment is set forth in a block schematic diagram and given the general reference character 500. Semiconductor storage device 500 can include constituents that are similar to constituents of Semiconductor storage device 1000 of FIG. 10, such constituents will be given the same reference character. Descriptions of such constituents may be omitted.

Semiconductor storage device 500 can include an internal voltage driver 6 which can provide a sense amplifier drive voltage VINT. However, semiconductor storage device may not include an internal voltage driver 5. Semiconductor storage device 500 can further include sense amplifier control circuits (SCB0 to SCB16) and sense amplifier drivers (DRB0 to DRB16). Otherwise, semiconductor storage device 500 of FIG. 5 can have similar constituents to the conventional semiconductor storage device 1000 of FIG. 10.

In the embodiment of FIG. 5, internal voltage driver 6 can generate a sense amplifier drive voltage VINT. Internal voltage driver 6, in the embodiment of FIG. 5, can operate in generally the same manner as internal voltage driver 6 in the embodiment of FIG. 1.

Figure 6:
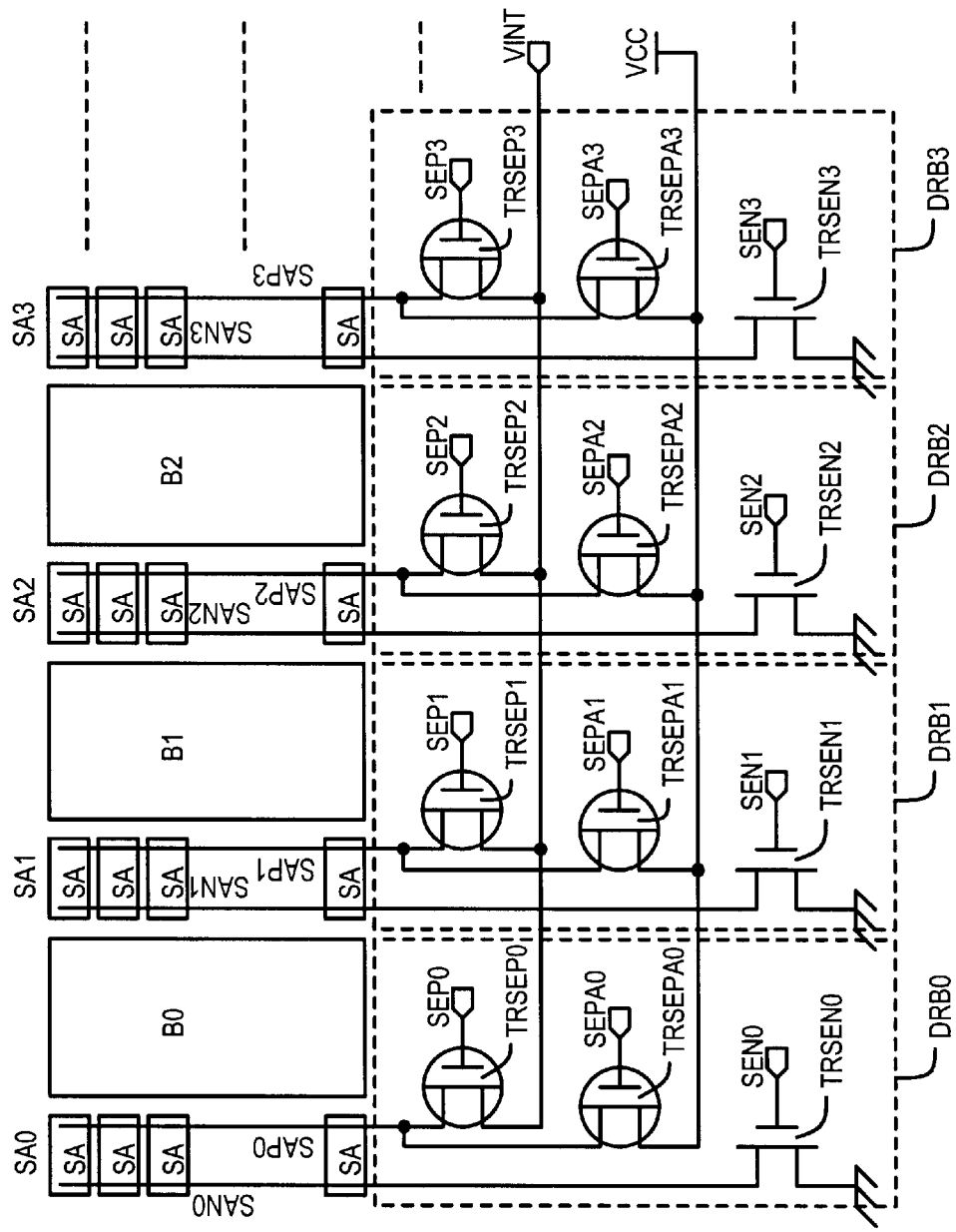
FIG. 6 is a block schematic diagram of a portion of the semiconductor storage device of FIG. 5.

Referring now to FIG. 6, a portion of semiconductor storage device 500 is set forth in a block schematic diagram. The portion of semiconductor storage device 500 illustrates three banks (B0 to B2), four sense amplifier rows (SA0 to SA3), and four sense amplifier drivers (DRB0 to DRB3).

Sense amplifier drivers (DRB0 to DRB3) can receive high and low sense line drive control signals (SEP0 to SEP3, SEPA1 to SEPA3, and SEN0 to SEN3) from sense amplifier control circuit (SCB0 to SCB3), respectively. Sense amplifier drivers (DRB0 to DRB3) can also receive sense amplifier drive voltage VINT, high voltage source VCC, and low voltage source VSS. Sense amplifier drivers (DRB0 to DRB3) can provide high and low sense line potentials to high and low sense line drive signals (SEP0 to SEP3 and SEN0 to SEN3), respectively.

Each sense amplifier driver (DRB0 to DRB3) can include a high sense amplifier drive circuit (TRSEP0 to TRSEP3), respectively. High sense amplifier drive circuit (TRSEP0 to TRSEP3) each can receive a high sense drive line control signal (SEP0 to SEP3), respectively. When a respective high sense drive line control signal (SEP0 to SEP3) is in an enabled state (logic low), the corresponding high sense amplifier drive circuit (TRSEP0 to TRSEP3) can provide a low impedance between sense amplifier drive voltage VINT and the respective high sense amplifier drive line (SAP0 to SAP3). When a respective high sense drive line control signal (SEP0 to SEP3) is in a not enabled state (logic high), the corresponding high sense amplifier drive circuit (TRSEP0 to TRSEP3) can provide a high impedance between sense amplifier drive voltage VINT and the respective high sense amplifier drive line (SAP0 to SAP3). Each high sense amplifier drive circuit (TRSEP0 to TRSEP3) can be a p-channel IGFET.

Each sense amplifier driver (DRB0 to DRB3) can also include a high sense amplifier boost drive circuit (TRSEPA0 to TRSEPA3), respectively. High sense amplifier boost drive circuits (TRSEPA0 to TRSEPA3) each can receive a high sense drive line boost control signal (SEPA0 to SEPA3), respectively. When a respective high sense drive line boost control signal (SEPA0 to SEPA3) is in an enabled state (logic low), the corresponding high sense amplifier boost drive circuit (TRSEPA0 to TRSEPA3) can provide a low impedance between high voltage source VCC and the respective high sense amplifier drive line (SAP0 to SAP3). When a respective high sense drive line boost control signal (SEPA0 to SEPA3) is in a not enabled state (logic high), the corresponding high sense amplifier boost drive circuit (TRSEPA0 to TRSEPA3) can provide a high impedance between high voltage source VCC and the respective high sense amplifier drive line (SAP0 to SAP3). Each high sense amplifier boost drive circuit (TRSEPA0 to TRSEPA3) can be a p-channel IGFET.

Each sense amplifier driver (DRB0 to DRB3) can also include a low sense amplifier drive circuit (TRSEN0 to TRSEN3), respectively. Low sense amplifier drive circuit (TRSEN0 to TRSEN3) each can receive a low sense drive line control signal (SEN0 to SEN3), respectively. When a respective low sense drive line control signal (SEN0 to SEN3) is in an enabled state (logic high), the corresponding low sense amplifier drive circuit (TRSEN0 to TRSEN3) can provide a low impedance between low voltage source VSS and the respective low sense amplifier drive line (SAN0 to SAN3). When a respective low sense line drive signal (SEN0 to SEN3) is in an not enabled state (logic low), the corresponding low sense amplifier drive circuit (TRSEN0 to TRSEN3) can provide a high impedance between low voltage source VSS and the respective low sense amplifier drive line (SAN0 to SAN3). Each low sense amplifier drive circuit (TRSEN0 to TRSEN3) can be an n-channel IGFET.

Referring once again to FIG. 5, sense amplifier control circuits (SCB0 to SCB16) can be provided to correspond to sense amplifier drivers (DRB0 to DRB16), respectively. When sense enable signal SE becomes active (high, in this case), selected sense amplifier control circuits (SCB0 to SCB16) can place their corresponding low and high sense drive line control signals (SEP0 to SEP16 and SEN0 to SEN16) into an active state according to predetermined timings. In addition, the selected sense amplifier control circuits (SCB0 to SCB16) may place their corresponding high sense drive line boost control signal (SEPA0 to SEPA16) in an active state according to a predetermined boost timing. In the case in which a certain bank (B0 to B15) is activated, the activated bank's adjacent sense amp rows (SA0 to SA16) can be activated along with their corresponding sense amplifier drivers (DRB0 to DRB16) and sense amplifier control circuits (SCB0 to SCB16).

The operation of the semiconductor storage device 500 will now be described.

The following is an example for a case in which bank B0 can become active and while data is being read out of bank B0, bank B2 can become activated in preparation for data being read out after the read operation from bank B0 is completed. Initially no banks are activated. Initial conditions of address enable signal AE, sense enable signal SE, bank selection signals (BS0 to BS15), bank enable signals (BE0 to BE15), overdrive signal VOP and low sense drive line control signals (SEN0 to SEN16) may all be in their not enabled condition and are thus at a logic low. Initial conditions of the high sense drive line control signals (SEP0 to SEP16) and high sense drive line boost control signals (SEPA0 to SEPA16) may all be in their not enabled condition and are thus at a logic high.

First, the semiconductor storage device 500 can receive a bank activate command to activate bank B0. In the bank activate command an address signal ADR can be received which includes a bank address for bank B0, as well as a row address RA. The bank activate command can be received by a command decoder (not shown). The row address activation signal RAA can then be enabled for a predetermined period (a few nanoseconds, as just an example) and timing control circuit 1 can then activate address enable signal AE for a predetermined period (a few nanoseconds, as just an example), thus allowing the row and bank addresses to be latched in row address buffer 2 and bank decoder 3, respectively.

Bank decoder 3 can then activate bank selection signal BS0. With the bank selection signal BS0 activated (logic high in this case), bank enable signal generation circuit EC0 can activate the bank enable signal BE0.

When bank enable signal BE0 activated (logic high in this case), row decoder DC0 can decode the row address signal RA and activate the word line specified by the row address signal RA.

When bit lines pairs have achieved a sufficient voltage differential, timing control circuit 1 can place the sense enable signal SE in the enable state (logic high in this case) for a predetermined period (a few nanoseconds, as just an example).

Figure 7:
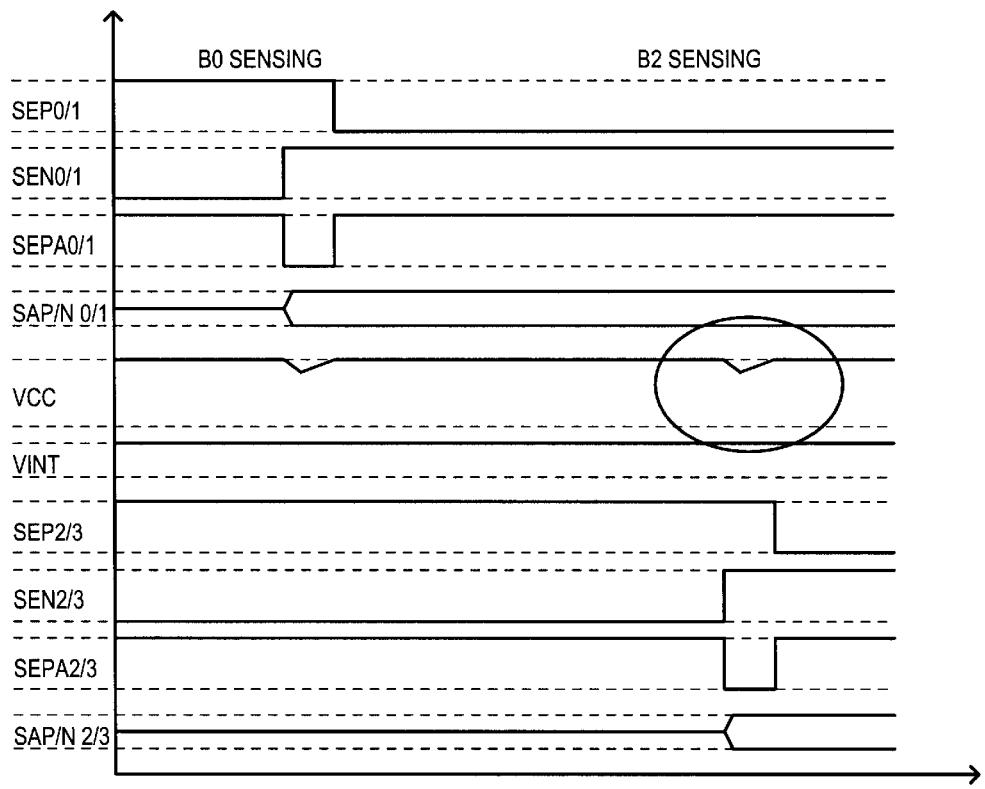
FIG. 7 is a timing diagram illustrating sensing operations of the semiconductor storage device of FIG. 5.
Figure 13:
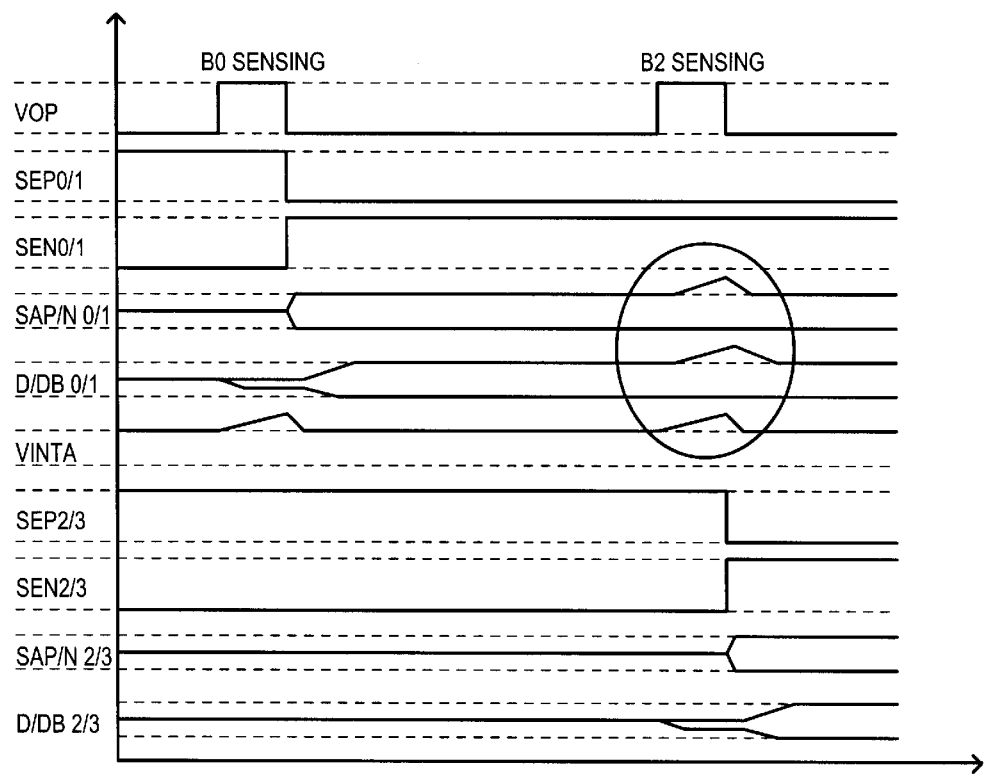
FIG. 13 is a timing diagram illustrating sensing operations of the conventional semiconductor storage device of FIG. 10.

Referring now to FIG. 7, a timing diagram is set forth illustrating the sensing operation of the semiconductor storage device 500. The timing diagram of FIG. 7 includes waveforms sense amplifier drive voltage VINT and high voltage source VCC. The timing diagram of FIG. 7 also includes bank B0 sense signals, such as high sense drive line control signals SEP0/1 (indicating SEP0 and SEP1), high sense drive line boost control signals SEPA0/1 (indicating SEPA0 and SEPA1), low sense drive line control signals SEN0/1 (indicating SEN0 and SEN1), and sense drive lines SAP/N 0/1 (indicating SAP0, SAP1, SAN0, and SAN1). The timing diagram of FIG. 7 further includes bank B2 sense signals, such as high sense drive line control signals SEP2/3 (indicating SEP2 and SEP3), high sense drive line boost control signals SEPA2/3 (indicating SEPA2 and SEPA3), low sense drive line control signals SEN2/3 (indicating SEN2 and SEN3), and sense drive lines SAP/N 2/3 (indicating SAP2, SAP3, SAN2, and SAN3).

A predetermined period (several nanoseconds for example) after sense enable signal SE becomes activated (logic high in this case), selected sense amplifier control circuits (SCB0 and SCB1) can set high sense amplifier drive line boost control signals (SEPA0 and SEPA1) to the overdrive state (logic low) for a predetermined period (for as long as several nanoseconds, for example). During the period in which sense amplifier boost control signals (SEPA0 and SEPA1) are in the overdrive state, sense amplifier drivers (DRB0 and DRB1) can provide a low impedance path between high sense drive lines (SEP0 and SEP1) and high power supply VCC. VCC can be a high external power supply.

With high sense drive line boost control signal SEPA0 at a logic low level, high sense amplifier boost drive circuit TRSEPA0, shown in FIG. 6, can provide a low impedance path between high sense drive line SAP0 and high power supply voltage VCC. With high sense drive line boost control signal SEPA1 at a logic low level, high sense amplifier boost drive circuit TRSEPA1, shown in FIG. 6, can provide a low impedance path between high sense drive line SAP1 and high power supply voltage VCC. With low sense drive line control signal SEN0 at a logic high level, low sense amplifier drive circuit TRSEN0, shown in FIG. 6, can provide a low impedance path between low sense drive line SAN0 and low voltage source VSS. With low sense drive line control signal SEN1 at a logic high level, low sense amplifier drive circuit TRSEN1, shown in FIG. 6, can provide a low impedance path between low sense drive line SAN1 and low voltage source VSS.

With high and low sense amplifier drive circuits (TRSEPA0/1 and TRSEN0/1) activated, high and low sense drive lines (SAP0/1 and SAN0/1) can be driven to the high power supply voltage VCC and low voltage source VSS, respectively. In this manner sense amplifier rows (SA0 and SA1) can become activated and amplify potential differences in each bit line pair of bank B0.

After a predetermined time period (for example, several nanoseconds), sense amplifier control circuits SCB0 and SCB1 can return high drive line boost control signals SEPA0 and SCPA1 to a disabled state (logic high in this case). At this time, sense amplifier control circuits SCB0 and SCB1 can place high drive line control signals SEP0 and SEP1 in an enable state (logic low in this case).

With high sense drive line boost control signal SEPA0 at a logic high level, high sense amplifier boost drive circuit TRSEPA0, shown in FIG. 6, can provide a high impedance path between high sense drive line SAP0 and high power supply voltage VCC. With high sense drive line boost control signal SEPA1 at a logic high level, high sense amplifier boost drive circuit TRSEPA1, shown in FIG. 6, can provide a high impedance path between high sense drive line SAP1 and high power supply voltage VCC. With high sense drive line control signal SEP0 at a logic low level, high sense amplifier drive circuit TRSEP0, shown in FIG. 6, can provide a low impedance path between high sense drive line SAP0 and sense amplifier drive voltage VINT. With high sense drive line control signal SEP1 at a logic low level, high sense amplifier drive circuit TRSEP1, shown in FIG. 6, can provide a low impedance path between high sense drive line SAP1 and sense amplifier drive voltage VINT.

In this manner, the voltage of the selected high sense drive lines (SAP0 and SAP1) can be maintained at a potential level sense amplifier drive voltage VINT.

After the sense amplifier rows (SA0 and SA1) have properly sensed data from the selected row of memory cells in bank B0, a column decoder (not illustrated) can decode a received column address. Based on the column address, the column decoder can turn on a column selection switch, which can allow a selected sense amplifier to drive sensed data to an I/O. The data can then propagate through a data amplifier, output buffer and onto an I/O pad to be provided onto a bus external to the bus (none of which is illustrated). Through this process, data can be read out from bank B0.

During the time in which bank B0 remains activated, a bank activation command for bank B2 can be received by the semiconductor storage device 500. Similarly to the bank activation command for bank B0, an address signal ADR specifying the bank (B2) and a row address signal RA is supplied to the semiconductor storage device 500. Bank enable signal BE2 corresponding to bank B2 can then be activated.

When bank enable signal BE2 activated (logic high in this case), row decoder DC2 can decode the row address signal RA and activate the word line specified by the row address signal RA.

When bit lines pairs have achieved a sufficient voltage differential, timing control circuit 1 can place the sense enable signal SE in the enable state (logic high in this case) for a predetermined period (a few nanoseconds, as just an example).

When sense enable signal SE has been placed in the enable state, sense amplifier rows (SA2 and SA3) located at opposite sides of the selected bank B2 can amplify the potential differences in on the bit line pairs and can provide a row of data which can be selected by column addresses.

A predetermined period (several nanoseconds for example) after sense enable signal SE becomes activated (logic high in this case), selected sense amplifier control circuits (SCB2 and SCB3) can set high sense amplifier drive line boost control signals (SEPA2 and SEPA3) to the overdrive state (logic low) for a predetermined period (for as long as several nanoseconds, for example). During the period in which sense amplifier boost control signals (SEPA2 and SEPA3) are in the overdrive state, sense amplifier drivers (DRB2 and DRB3) can provide a low impedance path between high sense drive lines (SEP2 and SEP3) and high power supply VCC. VCC can be a high external power supply.

With high sense drive line boost control signal SEPA2 at a logic low level, high sense amplifier boost drive circuit TRSEPA2, shown in FIG. 6, can provide a low impedance path between high sense drive line SAP2 and high power supply voltage VCC. With high sense drive line boost control signal SEPA3 at a logic low level, high sense amplifier boost drive circuit TRSEPA3, shown in FIG. 6, can provide a low impedance path between high sense drive line SAP3 and high power supply voltage VCC. With low sense drive line control signal SEN2 at a logic high level, low sense amplifier drive circuit TRSEN2, shown in FIG. 6, can provide a low impedance path between low sense drive line SAN2 and low voltage source VSS. With low sense drive line control signal SEN3 at a logic high level, low sense amplifier drive circuit TRSEN3, shown in FIG. 6, can provide a low impedance path between low sense drive line SAN3 and low voltage source VSS.

With high and low sense amplifier drive circuits (TRSEPA2/3 and TRSEN2/3) activated, high and low sense drive lines (SAP0/1 and SAN0/1) can be driven to the high power supply voltage VCC and low voltage source VSS, respectively. In this manner sense amplifier rows (SA2 and SA3) can become activated and amplify potential differences in each bit line pair of bank B2.

After a predetermined time period (for example, several nanoseconds), sense amplifier control circuits SCB2 and SCB3 can return high drive line boost control signals SEPA2 and SEPA3 to a disabled state (logic high in this case). At this time, sense amplifier control circuits SCB2 and SCB3 can place high drive line control signals SEP2 and SEP3 in an enable state (logic low in this case).

With high sense drive line boost control signal SEPA2 at a logic high level, high sense amplifier boost drive circuit TRSEPA2, shown in FIG. 6, can provide a high impedance path between high sense drive line SAP2 and high power supply voltage VCC. With high sense drive line boost control signal SEPA3 at a logic high level, high sense amplifier boost drive circuit TRSEPA3, shown in FIG. 6, can provide a high impedance path between high sense drive line SAP3 and high power supply voltage VCC. With high sense drive line control signal SEP2 at a logic low level, high sense amplifier drive circuit TRSEP2, shown in FIG. 6, can provide a low impedance path between high sense drive line SAP2 and sense amplifier drive voltage VINT. With high sense drive line control signal SEP3 at a logic low level, high sense amplifier drive circuit TRSEP3, shown in FIG. 6, can provide a low impedance path between high sense drive line SAP3 and sense amplifier drive voltage VINT.

In this manner, the voltage of the selected high sense drive lines (SAP2 and SAP3) can be maintained at a potential level sense amplifier drive voltage VINT.

After the sense amplifier rows (SA2 and SA3) have properly sensed data from the selected row of memory cells in bank B2, a column decoder (not illustrated) can decode a received column address. Based on the column address, the column decoder can turn on a column selection switch, which can allow a selected sense amplifier to drive sensed data to an I/O. The data can then propagate through a data amplifier, output buffer and onto an I/O pad to be provided onto a bus external to the bus (none of which is illustrated). Through this process, data can be read out from bank B2.

In the present embodiment of FIGS. 5 through 7, only selected ones of high sense amplifier drive lines (SAP0 to SAP16) corresponding to sense amplifier rows (SA0 to SA16) can receive high power supply voltage VCC during an initial sense operation. Referring to FIG. 7, it can be seen that high sense amplifier drive line boost control signals (SEPA0/1 and SEPA2/3) can be enabled for only a predetermined period (for example, several nanoseconds) after the start of a sensing operation by sense amplifier rows (SA0–SA1 and SA2–SA3), respectively. After the predetermined period, high sense amplifier drive line boost control signals (SEPA0/1 and SEPA2/3) can be disabled (logic high, in this case). In this manner, only the sense amp rows (SA0–SA1 and SA2–SA3) that are in a high current sink mode of operation can receive high power supply voltage VCC which can be an external power supply and may have higher current sourcing capabilities.

Thus, high power supply voltage VCC can be supplied only to sense amplifier rows (SA0 to SA16) sensing a row of data in a selected bank (B0 to B15) at the start of the sensing operation. Thereafter, high power supply voltage VCC may not be supplied to those sense amplifier rows (SA0 to SA16) that have completed the sensing operation and may simply be holding data in sense amplifier latches.

As a result, the potential of the high sense amplifier drive line of sense amplifier rows (SA0 to SA16) that have completed the sensing operation and may simply be holding data in sense amplifier latches may not be raised above the potential of sense amplifier drive voltage VINT, which may not be boosted.

Figure 8:
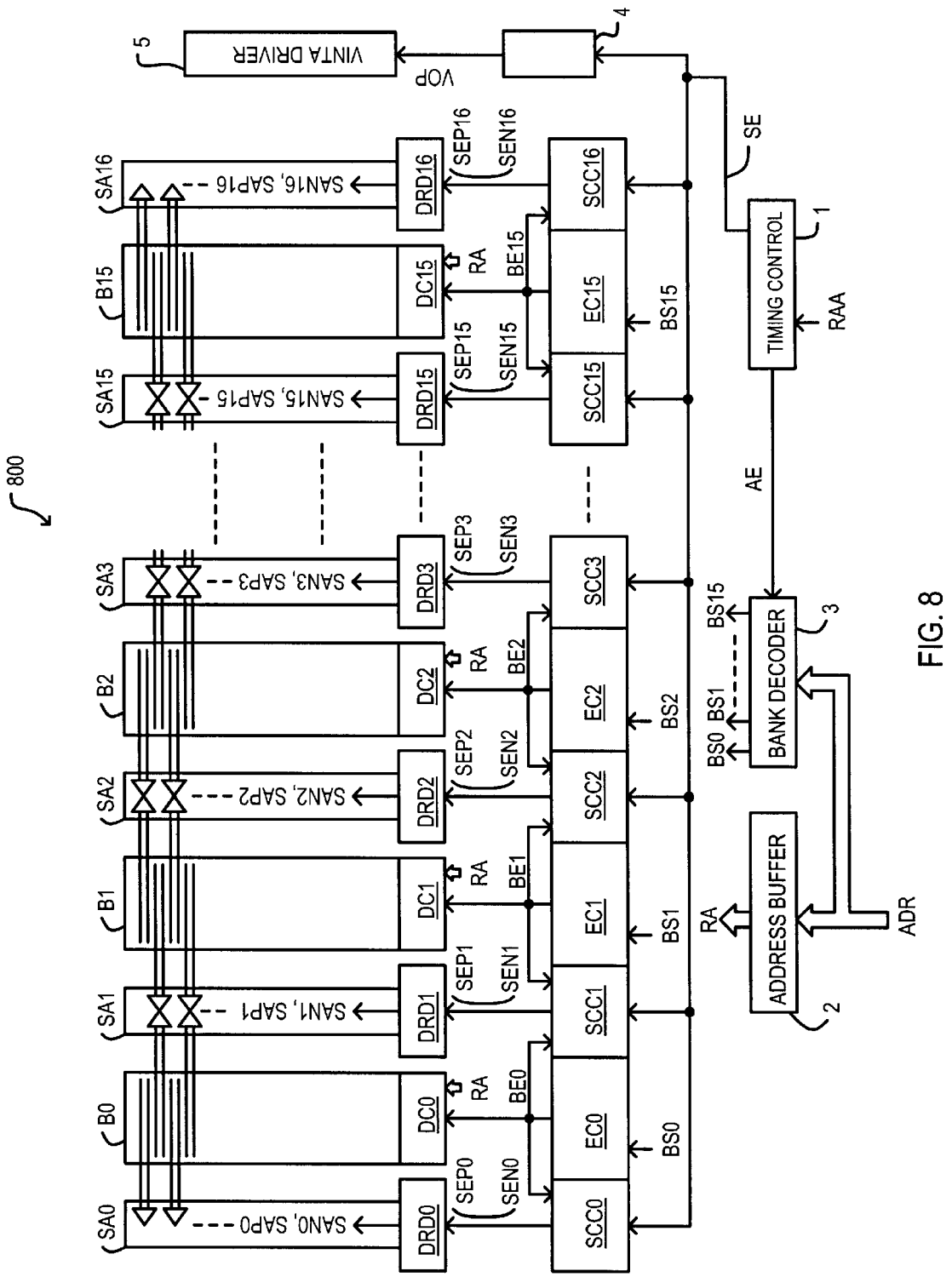
FIG. 8 is a block schematic diagram of a semiconductor storage device according to an embodiment.

Referring now to FIG. 8, a semiconductor storage device according to an embodiment is set forth in a block schematic diagram and given the general reference character 800. Semiconductor storage device 800 can include constituents that are similar to constituents of Conventional semiconductor storage device 1000 of FIG. 10, such constituents will be given the same reference character. Descriptions of such constituents may be omitted.

Semiconductor storage device 800 can further include sense amplifier control circuits (SCC0 to SCC16). Otherwise, semiconductor storage device 800 of FIG. 8 can have similar constituents to the conventional semiconductor storage device 1000 of FIG. 10.

Referring once again to FIG. 8, sense amplifier control circuits (SCC0 to SCC16) can be provided to correspond to sense amplifier drivers (DRD0 to DRD16), respectively. When sense enable signal becomes active (high, in this case), selected sense amplifier control circuits (SCC0 to SCC16) can place their corresponding low and high sense drive line control signals (SEP0 to SEP16 and SEN0 to SEN16) into an active state according to predetermined timings.

The operation of the semiconductor storage device 800 will now be described.

The following is an example for a case in which bank B0 can become active and while data is being read out of bank B0, bank B2 can become activated in preparation for data being read out after the read operation from bank B0 is completed. Initially no banks are activated. Initial conditions of address enable signal AE, sense enable signal SE, bank selection signals (BS0 to BS15), bank enable signals (BE0 to BE15), overdrive signal VOP and low sense drive line control signals (SEN0 to SEN16) may all be in their not enabled condition and are thus at a logic low. Initial conditions of the high sense drive line control signals (SEP0 to SEP16) may all be in their not enabled condition and are thus at a logic high.

First the semiconductor storage device 800 can receive a bank activate command to activate bank B0. In the bank activate command an address signal ADR can be received which includes a bank address for bank B0, as well as a row address RA. The bank activate command can be received by a command decoder (not shown). The row address activation signal RAA can then be enabled for a predetermined period (a few nanoseconds, as just an example) and timing control circuit 1 can then activate address enable signal AE for a predetermined period (a few nanoseconds, as just an example), thus allowing the row and bank addresses to be latched in row address buffer 2 and bank decoder 3, respectively.

Bank decoder 3 can then activate bank selection signal BS0. With the bank selection signal BS0 activated (logic high in this case), bank enable signal generation circuit EC0 can activate the bank enable signal BE0.

When bank enable signal BE0 activated (logic high in this case), row decoder DC0 can decode the row address signal RA and activate the word line specified by the row address signal RA.

When bit lines pairs have achieved a sufficient voltage differential, timing control circuit 1 can place the sense enable signal SE in the enable state (logic high in this case) for a predetermined period (a few nanoseconds, as just an example).

Figure 9:
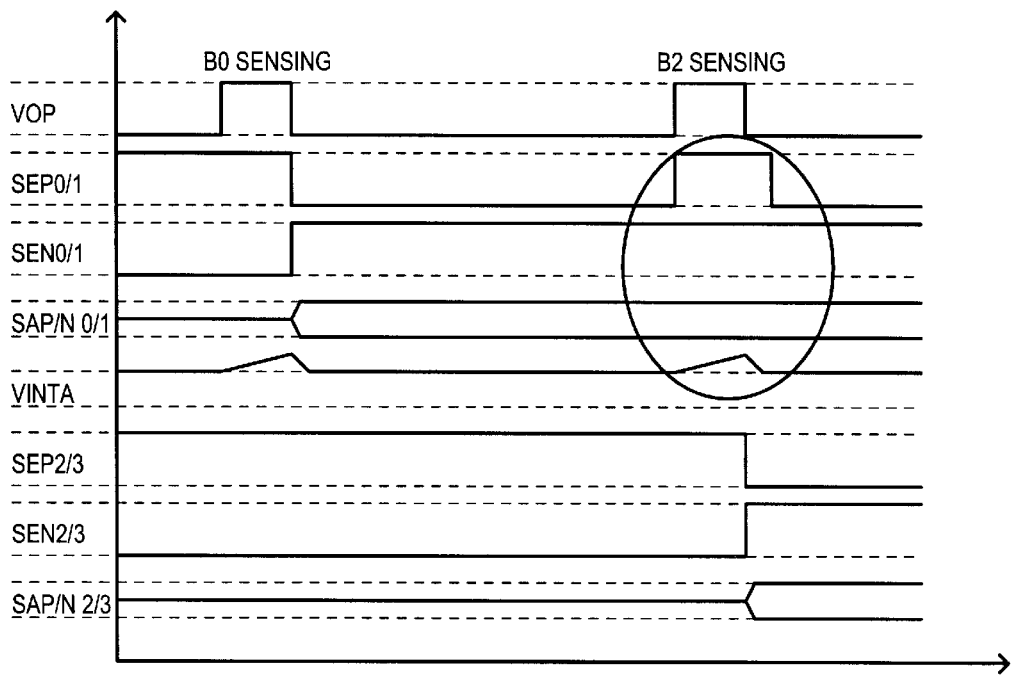
FIG. 9 is a timing diagram illustrating sensing operations of the semiconductor storage device of FIG. 8.

Referring now to FIG. 9, a timing diagram is set forth illustrating the sensing operation of the semiconductor storage device 800. The timing diagram of FIG. 8 includes waveforms for overdrive signal VOP and sense amplifier drive voltage VINTA. The timing diagram of FIG. 4 also includes bank B0 sense signals, such as high sense drive line control signals SEP0/1 (indicating SEP0 and SEP1), low sense drive line control signals SEN0/1 (indicating SEN0 and SEN1), and sense drive lines SAP/N0/1 (indicating SAP0, SAP1, SAN0, and SAN1). The timing diagram of FIG. 9 further includes bank B2 sense signals, such as high sense drive line control signals SEP2/3 (indicating SEP2 and SEP3), low sense drive line control signals SEN2/3 (indicating SEN2 and SEN3), and sense drive lines SAP/N 2/3 (indicating SAP2, SAP3, SAN2, and SAN3).

When sense enable signal SE becomes activated (logic high in this case), pulse generation circuit 4 can set overdrive signal VOP to the overdrive state (logic high) for a predetermined period (for as long as several nanoseconds, for example). During the period in which overdrive signal VOP is in the overdrive state, internal voltage driver 5 can overdrive the sense amplifier drive voltage VINTA towards the external power source voltage VCC by providing a low impedance path from sense amplifier drive voltage VINTA to the external power source voltage VCC.

When overdrive signal VOP returns low, the overdrive condition of sense amplifier drive voltage VINTA can be terminated. At this time, sense amplifier control circuit SCC0 can set the high sense drive line control signal SEP0 to a low logic level and the low sense drive line control signal SEN0 to a high logic level. At the same time, sense amplifier control circuit SCC1 can set the high sense drive line control signal SEP1 to a low logic level and the low sense drive line control signal SEN1 to a high logic level.

Figure 12:
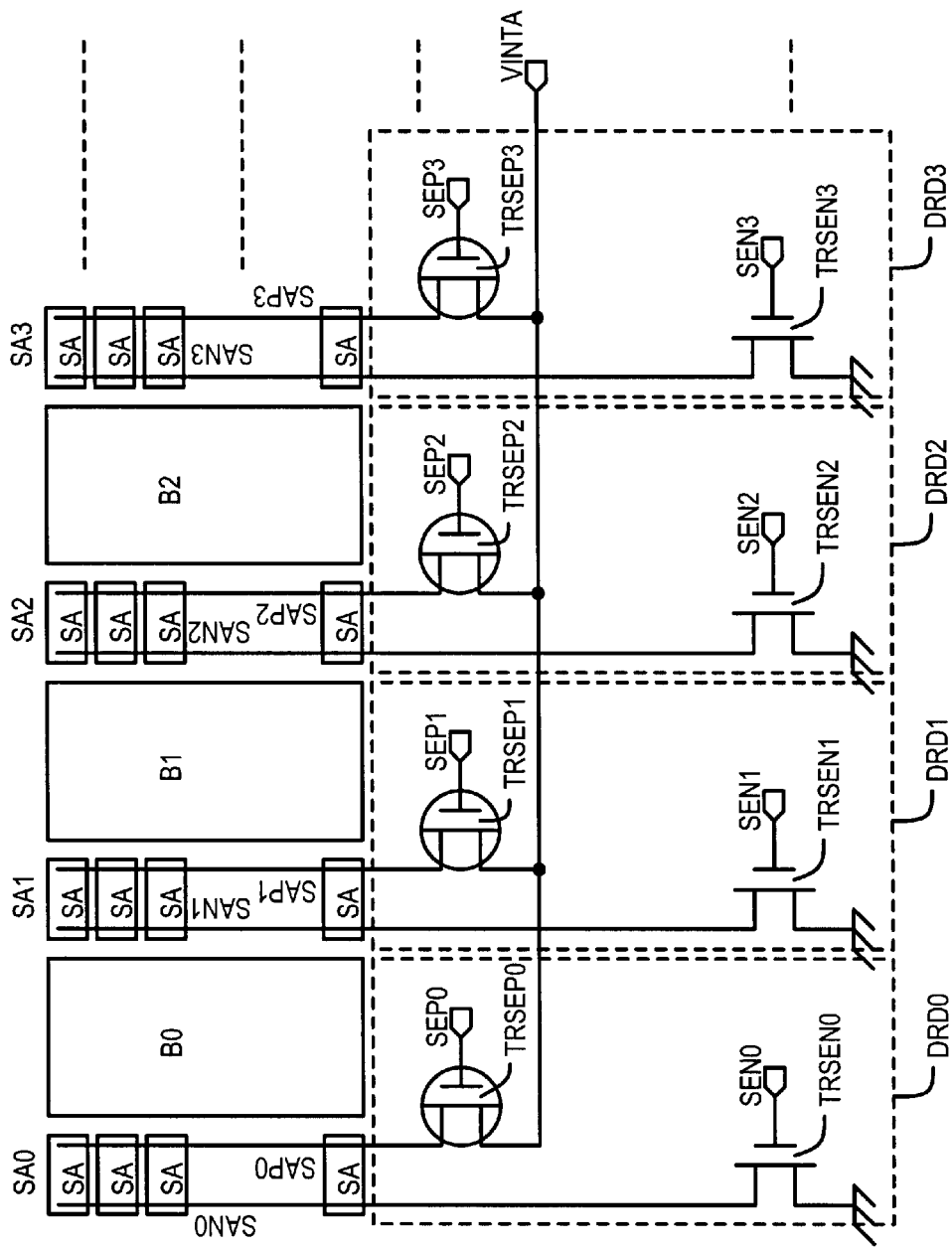
FIG. 12 is a block schematic diagram of a portion of the semiconductor storage device of FIG. 10.

With high sense drive line control signal SEP0 at a logic low level, high sense amplifier drive circuit TRSEP0, shown in FIG. 12, can provide a low impedance path between high sense drive line SAP0 and sense amplifier drive voltage VINTA. With high sense drive line control signal SEP1 at a logic low level, high sense amplifier drive circuit TRSEP1, shown in FIG. 12, can provide a low impedance path between high sense drive line SAP1 and sense amplifier drive voltage VINTA. With low sense drive line control signal SEN0 at a logic high level, low sense amplifier drive circuit TRSEN0, shown in FIG. 12, can provide a low impedance path between low sense drive line SAN0 and low voltage source VSS. With low sense drive line control signal SEN1 at a logic high level, low sense amplifier drive circuit TRSEN1, shown in FIG. 12, can provide a low impedance path between low sense drive line SAN1 and low voltage source VSS.

With high and low sense amplifier drive circuits (TRSEP0/1 and TRSEN0/1) activated, high and low sense drive lines (SAP0/1 and SAN0/1) can be driven to the sense amplifier drive voltage VINTA and low voltage source VSS, respectively. In this manner sense amplifier rows (SA0 and SA1) can become activated and amplify potential differences in each bit line pair of bank B0.

In this manner, the voltage of the selected high sense drive lines (SAP0 and SAP1) can be maintained at a potential level sense amplifier drive voltage VINTA.

After the sense amplifier rows (SA0 and SA1) have properly sensed data from the selected row of memory cells in bank B0, a column decoder (not illustrated) can decode a received column address. Based on the column address, the column decoder can turn on a column selection switch, which can allow a selected sense amplifier to drive sensed data to an I/O. The data can then propagate through a data amplifier, output buffer and onto an I/O pad to be provided onto a bus external to the bus (none of which is illustrated). Through this process, data can be read out from bank B0.

During the time in which bank B0 remains activated, a bank activation command for bank B2 can be received by the semiconductor storage device 100. Similarly to the bank activation command for bank B0, an address signal ADR specifying the bank (B2) and a row address signal RA is supplied to the semiconductor storage device 100. Bank enable signal BE2 corresponding to bank B2 can then be activated.

When bank enable signal BE2 activated (logic high in this case), row decoder DC2 can decode the row address signal RA and activate the word line specified by the row address signal RA.

When bit lines pairs have achieved a sufficient voltage differential, timing control circuit 1 can place the sense enable signal SE in the enable state (logic high in this case) for a predetermined period (a few nanoseconds, as just an example).

When sense enable signal SE has been placed in the enable state, sense amplifier rows (SA2 and SA3) located at opposite sides of the selected bank B2 can amplify the potential differences in on the bit line pairs and can provide a row of data which can be selected by column addresses.

When sense enable signal SE becomes activated (logic high in this case), pulse generation circuit 4 can set overdrive signal VOP to the overdrive state (logic high) for a predetermined period (for as long as several nanoseconds, for example). During the period in which overdrive signal VOP is in the overdrive state, internal voltage driver 5 can overdrive the sense amplifier drive voltage VINTA towards the external power source voltage VCC by providing a low impedance path from sense amplifier drive voltage VINTA to the external power source voltage VCC.

Additionally, when sense enable signal SE becomes activated, sense amplifier control circuit SCC0 can set the high sense drive line control signal SEP0 to a high logic level for a predetermined period (for example, several nanoseconds). At the same time, sense amplifier control circuit SCC1 can set the high sense drive line control signal SEP1 to a high logic level for a predetermined period (for example, several nanoseconds).

With high sense drive line control signal SEP0 at a logic high level, high sense amplifier drive circuit TRSEP0, shown in FIG. 12, can provide a high impedance path between high sense drive line SAP0 and sense amplifier drive voltage VINTA. With high sense drive line control signal SEP1 at a logic high level, high sense amplifier drive circuit TRSEP1, shown in FIG. 12, can provide a high impedance path between high sense drive line SAP1 and sense amplifier drive voltage VINTA.

When overdrive signal VOP returns low, the overdrive condition of sense amplifier drive voltage VINTA can be terminated. At this time, sense amplifier control circuit SCC2 can set the high sense drive line control signal SEP2 to a low logic level and the low sense drive line control signal SEN2 to a high logic level. At the same time, sense amplifier control circuit SCC3 can set the high sense drive line control signal SEP3 to a low logic level and the low sense drive line control signal SEN3 to a high logic level.

With high sense drive line control signal SEP2 at a logic low level, high sense amplifier drive circuit TRSEP2, shown in FIG. 12, can provide a low impedance path between high sense drive line SAP2 and sense amplifier drive voltage VINTA. With high sense drive line control signal SEP3 at a logic low level, high sense amplifier drive circuit TRSEP3, shown in FIG. 12, can provide a low impedance path between high sense drive line SAP3 and sense amplifier drive voltage VINTA. With low sense drive line control signal SEN2 at a logic high level, low sense amplifier drive circuit TRSEN2, shown in FIG. 12, can provide a low impedance path between low sense drive line SAN2 and low voltage source VSS. With low sense drive line control signal SEN3 at a logic high level, low sense amplifier drive circuit TRSEN3, shown in FIG. 12, can provide a low impedance path between low sense drive line SAN3 and low voltage source VSS.

With high and low sense amplifier drive circuits (TRSEP2/3 and TRSEN2/3) activated, high and low sense drive lines (SAP2/3 and SAN2/3) can be driven to the sense amplifier drive voltage VINTA and low voltage source VSS, respectively. In this manner sense amplifier rows (SA2 and SA3) can become activated and amplify potential differences in each bit line pair of bank B2.

After the sense amplifier rows (SA2 and SA3) have properly sensed data from the selected row of memory cells in bank B2, a column decoder (not illustrated) can decode a received column address. Based on the column address, the column decoder can turn on a column selection switch, which can allow a selected sense amplifier to drive sensed data to an I/O. The data can then propagate through a data amplifier, output buffer and onto an I/O pad to be provided onto a bus external to the bus (none of which is illustrated). Through this process, data can be read out from bank B2.

In the present embodiment of FIG. 8, only selected ones of high sense amplifier drive lines (SAP0 to SAP16) corresponding to sense amplifier rows (SA0 to SA16) can receive sense amplifier drive voltage VINTA during an initial sense operation. Referring to FIG. 9, it can be seen that high sense amplifier drive line control signals SEP0/1 can be disabled for only a predetermined period (for example, several nanoseconds) after the start of a sensing operation by sense amplifier rows (SA2 and SA3). After the predetermined period, high sense amplifier drive line control signals SEP0/1 can be enabled (logic low, in this case). In this manner, only the sense amp row (SA0–SA1 and SA2–SA3) that are in a high current sink mode of operation can receive the sense amplifier drive voltage VINTA which has a overdriven mode which can allow a boosted current sourcing capability during the initial portion of a sense cycle.

Thus, even when the sense amplifier driving voltage VINTA is overdriven, the overdriven sense amplifier drive voltage VINTA can be supplied only to sense amplifier rows (SA0 to SA16) sensing a row of data in a selected bank (B0 to B15) at the start of the sensing operation. During a predetermined period at an initial portion of a sensing operation, overdriven sense amplifier drive voltage VINTA may not be supplied to those sense amplifier rows (SA0 to SA16) that have completed the sensing operation and may simply be holding data in sense amplifier latches.

As a result, the potential of the high sense amplifier drive line of sense amplifier rows (SA0 to SA16) that have completed the sensing operation and may simply be holding data in sense amplifier latches may not be raised above a desired predetermined potential.

Because the embodiment of FIG. 8 may only require a single internal voltage driver 5, a smaller chip size can be achieved, and thus semiconductor storage device 800 can be manufactured at a lower cost.

In the embodiment of FIG. 8, sense amplifier drive circuit (DRD0 to DRD16) may not require high sense amplifier drive boost circuits (TRSEPA0 to TRSEPA15, as seen in FIGS. 3 and 6) thus semiconductor storage device 800 may be manufactured at a lower cost than semiconductor storage devices (300 and 600).

As described in the embodiments above, a voltage generating means for generating a voltage having increased drive capabilities and/or higher potential levels to be used at initial stages of a sensing operation can be shared by a plurality of sense amplifier rows. Adverse effects, such as increased bit line voltage levels on sense amplifier rows that have already completed sensing operations, may be reduced.

It is understood that the embodiments described above are exemplary and the present invention should not be limited to those embodiments. For example, high power source VCC can be a voltage supplied on an external pin or it could be a voltage that is stepped down from a voltage supplied from an external pin but still at a higher potential than reference voltage VREF. Likewise low power source VSS can be a voltage supplied on an external pin or it could be an internally regulated voltage used to reduce internal voltage swings on components such as bit lines, as just one example.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor storage device, comprising:
   a plurality of banks of memory cells;
   a plurality of sense amplifier rows coupled to the plurality of banks, each sense amplifier row includes a high sense drive line;
   a plurality of sense amplifier drivers coupled to the plurality of sense amplifier rows;
   each sense amplifier driver includes
      a high sense amplifier drive circuit coupled to receive a first high sense amplifier drive voltage and a high sense amplifier drive control signal, the high sense amplifier drive circuit being coupled to at least one of the high sense drive lines of the plurality of sense amplifier rows; and
      a high sense amplifier boost drive circuit coupled to receive a second high sense amplifier drive voltage and a high sense amplifier drive boost control signal, the high sense amplifier boost drive circuit being coupled to at least one of the high sense drive lines of the plurality of sense amplifier rows.

2. The semiconductor storage device of claim 1, wherein the high sense amplifier drive boost control signal enables the high sense amplifier boost drive circuit for a predetermined period during an initial portion of a sense operation.

3. The semiconductor storage device of claim 2, wherein:
   a first internal voltage driver providing the first high sense amplifier drive voltage; and
   a second internal voltage driver having an overdrive mode, the second internal voltage driver providing the second high sense amplifier drive voltage.

4. The semiconductor storage device of claim 3, wherein:
   each sense amplifier row senses data from one of the plurality of banks of memory cells during a sense operation;
   a first sense amplifier row corresponding to a first sense amplifier drive circuit;
   the first sense amplifier drive circuit having a first high sense amplifier drive boost control signal and a first high sense amplifier drive control signal;
   a second sense amplifier row corresponding to a second sense amplifier drive circuit;
   the second sense amplifier drive circuit having a second high sense amplifier drive boost control signal and a second high sense amplifier drive control signal;
   wherein when the first sense amplifier row is operating in a sense operation timing that is not the initial portion of a sense operation of the first sense amplifier row and the second sense amplifier row is operating in a sense operation timing that is the initial portion of a sense operation for the second sense amplifier row, the first high sense amplifier boost control signal is in the disabled state, the second high sense amplifier boost control signal is in the enabled state, the first high sense amplifier drive control signal is in the enabled state and the second high sense amplifier drive control signal is in the disabled state.

5. The semiconductor storage device of claim 2, wherein:
   a first internal voltage driver providing the first high sense amplifier drive voltage; and
   the second high sense amplifier drive voltage is a voltage source with a potential higher than the potential of the first high sense amplifier drive voltage.

6. The semiconductor storage device of claim 5, wherein:
   the voltage source is an externally applied voltage source.

7. The semiconductor storage device of claim 6, wherein:
   each sense amplifier row senses data from one of the plurality of banks of memory cells during a sense operation;
   a first sense amplifier row corresponding to a first sense amplifier drive circuit;
   the first sense amplifier drive circuit having a first high sense amplifier drive boost control signal and a first high sense amplifier drive control signal;
   a second sense amplifier row corresponding to a second sense amplifier drive circuit;
   the second sense amplifier drive circuit having a second high sense amplifier drive boost control signal and a second high sense amplifier drive control signal;
   when the first sense amplifier row is operating in a sense operation timing that is not the initial portion of a sense operation of the first sense amplifier row and the second sense amplifier row is operating in a sense operation timing that is the initial portion of a sense operation for the second sense amplifier row, the first high sense amplifier boost control signal is in the disabled state, the second high sense amplifier boost control signal is in the enabled state, the first high sense amplifier drive control signal is in the enabled state and the second high sense amplifier drive control signal is in the disabled state.

8. A semiconductor storage device having a bank activation command including a bank address, the semiconductor storage device comprising:
   a plurality of banks of memory cells, each bank of memory cells having a predetermined bank address;
   a plurality of sense amplifier rows coupled to the plurality of banks of memory cells wherein adjacent banks of memory cells share one of the plurality of sense amplifier rows, each sense amplifier row being coupled to a high sense drive line and a low sense drive line;
   a plurality of sense amplifier drivers, each sense amplifier driver being coupled to the high sense drive line of at least one of the plurality of sense amplifier rows;
   each sense amplifier driver including
      a high sense amplifier drive circuit coupled to receive a first high sense amplifier drive voltage, the high sense amplifier drive circuit coupling the first high sense amplifier drive voltage to the high sense drive line when a high sense amplifier drive control signal is in an enabled state; and
      a high sense amplifier boost drive circuit coupled to receive a second high sense amplifier drive voltage, the high sense amplifier boost drive circuit coupling the second high sense amplifier drive voltage to the high sense drive line when a high sense amplifier drive boost control signal is in a boost enabled state.

9. The semiconductor storage device of claim 8, wherein the high sense amplifier drive boost control signal enables the high sense amplifier boost drive circuit for a predetermined period during an initial portion of a sense operation.

10. The semiconductor storage device of claim 9, including a plurality of sense amplifier control circuits, the sense amplifier control circuits providing the high sense amplifier drive control signals and the high sense amplifier boost control signals.

11. The semiconductor storage device of claim 10, wherein:
- each sense amplifier row senses data from one of the plurality of banks of memory cells during a sense operation;
- a first sense amplifier row corresponds to a first sense amplifier drive circuit;
- the first sense amplifier drive circuit has a first high sense amplifier drive boost control signal and a first high sense amplifier drive control signal;
- a second sense amplifier row corresponds to a second sense amplifier drive circuit;
- the second sense amplifier drive circuit has a second high sense amplifier drive boost control signal and a second high sense amplifier drive control signal;
- wherein when the first sense amplifier row is operating in a sense operation timing that is not the initial portion of a sense operation of the first sense amplifier row and the second sense amplifier row is operating in a sense operation timing that is the initial portion of a sense operation for the second sense amplifier row, the first high sense amplifier boost control signal is in a boost disabled state, the second high sense amplifier boost control signal is in the boost enabled state, the first high sense amplifier drive control signal is in the enabled state and the second high sense amplifier drive control signal is in the disabled state.

12. The semiconductor storage device of claim 11, wherein:
- the high sense amplifier drive circuit is a p-channel IGFET; and
- the high sense amplifier drive boost circuit is a p-channel IGFET.

13. The semiconductor storage device of claim 8, wherein:
- a first internal voltage driver provides the first high sense amplifier drive voltage; and
- a second internal voltage driver has an overdrive mode and provides the second high sense amplifier drive voltage.

14. The semiconductor storage device of claim 8, wherein:
- a first internal voltage driver provides the first high sense amplifier drive voltage; and
- the second high sense amplifier drive voltage is a voltage source with a potential higher than the potential of the first high sense amplifier drive voltage.

15. A semiconductor storage device having a bank activation command including a bank address, the semiconductor storage device comprising:
- a first bank of memory cells having a first bank address;
- a second bank of memory cells having a second bank address;
- a first sense amplifier row coupled to the first bank of memory cells, the first sense amplifier row being coupled to a first high sense drive line and a first low sense drive line;
- a second sense amplifier row coupled to the second bank of memory cells, the second sense amplifier row being coupled to a second high sense drive line and a second low sense drive line;
- an internal voltage driver having an overdrive mode, the internal voltage driver providing a high sense amplifier drive voltage;
- a first sense amplifier driver coupled to the first high sense drive line of the first sense amplifier row, the first sense amplifier driver including a first high sense amplifier drive circuit that receives the high sense amplifier drive voltage and couples the high sense amplifier drive voltage to the first high sense drive line when a first high sense amplifier drive control signal is in an enabled state and electrically isolates the high sense amplifier drive voltage from the first high sense drive line when the first high sense amplifier drive control signal is in a disabled state; and
- a second sense amplifier driver coupled to the second high sense drive line of the second sense amplifier row, the second sense amplifier driver including a second high sense amplifier drive circuit that receives the high sense amplifier drive voltage and couples the high sense amplifier drive voltage to the second high sense drive line when a second high sense amplifier drive control signal is in the enabled state and electrically isolates the second sense amplifier drive voltage from the second high sense drive line when the second high sense amplifier drive control signal is in the disabled state; wherein
  - when the first sense amplifier row is operating in a sense operation timing that is not an initial portion of a sense operation of the first sense amplifier row and the second sense amplifier row is operating in a sense operation timing that is the initial portion of a sense operation for the second sense amplifier row, the first high sense amplifier control signal is in the disabled state and the second high sense amplifier control signal is in the enabled state.

16. The semiconductor storage device of claim 15, wherein the internal voltage driver is in the overdrive mode for a predetermined period during an initial portion of a sense operation.

17. The semiconductor storage device of claim 16 wherein, the internal voltage driver provides a low impedance path between the high sense amplifier drive voltage and a voltage source when in the overdrive mode.

18. The semiconductor storage device of claim 17, wherein the voltage source is an externally supplied voltage source.

19. The semiconductor storage device of claim 15, wherein when the first sense amplifier row is operating in a sense operation timing that is not the initial portion of a sense operation of the first sense amplifier row and the second sense amplifier row is operating in a sense operation timing that is not the initial portion of a sense operation for the second sense amplifier row, the first high sense amplifier control signal is in the enabled state and the second high sense amplifier control signal is in the enabled state.

20. The semiconductor storage device of claim 16, further including:
- a pulse generation circuit that generates an overdrive signal;
- the internal voltage driver is in the overdrive mode when the overdrive signal is in a first logic level and provides regulated voltage level when the overdrive signal is in a second logic level.

* * * * *